United States Patent
Kurjanowicz

(10) Patent No.: US 10,777,288 B2
(45) Date of Patent: Sep. 15, 2020

(54) ONE TIME PROGRAMMABLE (OTP) BIT CELL WITH INTEGRATED INHIBIT DEVICE

(71) Applicant: Synopsys, Inc., Mountain View, CA (US)

(72) Inventor: Wlodek Kurjanowicz, Arnprior (CA)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/534,811

(22) Filed: Aug. 7, 2019

(65) Prior Publication Data

US 2020/0051653 A1 Feb. 13, 2020

Related U.S. Application Data

(60) Provisional application No. 62/715,614, filed on Aug. 7, 2018.

(51) Int. Cl.
*G11C 17/00* (2006.01)
*G11C 17/18* (2006.01)
(Continued)

(52) U.S. Cl.
CPC .............. *G11C 17/18* (2013.01); *G11C 17/10* (2013.01); *G11C 17/16* (2013.01);
(Continued)

(58) Field of Classification Search
CPC ......... G11C 17/18; G11C 17/10; G11C 17/16; H01L 23/5252; H01L 27/0203; H01L 27/101; H01L 27/112
See application file for complete search history.

(56) References Cited

U.S. PATENT DOCUMENTS 7,755,162 B2    7/2010  Kurjanowicz et al.
7,817,456 B2 *  10/2010  Kurjanowicz ......... G11C 17/10
                                                          365/195

(Continued)

FOREIGN PATENT DOCUMENTS

EP      0459633 A2    12/1991

OTHER PUBLICATIONS

Matsufuji, K. et al., "A 65nm Pure CMOS One-time Programmable Memory Using a Two-Port Antifuse Cell Implemented in a Matrix Structure," IEEE Asian Solid-State Circuits Conference, Nov. 12-14, 2007, pp. 212-215.

*Primary Examiner* — Pho M Luu
(74) *Attorney, Agent, or Firm* — Fenwick & West LLP

(57) ABSTRACT

A one-time programmable (OTP) memory device includes a memory array having multiple memory elements. The memory array includes a plurality of anti-fuse FinFETs and a plurality of access FinFETs. Each anti-fuse device has a first terminal for receiving a programming voltage and a second terminal. The anti-fuse FinFETs are located in a first region of an integrated circuit. At least one anti-fuse FinFET of the plurality of anti-fuse FinFETs and at least one access FinFET of the plurality of access FinFETs form a memory element of the plurality of memory elements of the memory array. Each access FinFET is configured to selectively couple one of a program inhibit voltage and a program enable voltage to the second terminal of a corresponding anti-fuse FinFET in a programming operation. The access FinFETs are located in a second region of the integrated circuit, different than the first region of the integrated circuit.

22 Claims, 26 Drawing Sheets

(51) Int. Cl.

| | |
|---|---|
| *G11C 17/10* | (2006.01) |
| *G11C 17/16* | (2006.01) |
| *H01L 27/10* | (2006.01) |
| *H01L 27/112* | (2006.01) |
| *H01L 23/525* | (2006.01) |
| *H01L 27/02* | (2006.01) |

(52) U.S. Cl.
CPC ...... *H01L 23/5252* (2013.01); *H01L 27/0203* (2013.01); *H01L 27/101* (2013.01); *H01L 27/112* (2013.01)

(56) References Cited

U.S. PATENT DOCUMENTS

| | | | |
|---|---|---|---|
| 7,944,727 B2* | 5/2011 | Kurjanowicz | G11C 17/10 365/225.7 |
| 8,526,254 B2* | 9/2013 | Kurjanowicz | G11C 29/24 365/201 |
| 8,787,092 B2 | 7/2014 | Chen et al. | |
| 9,275,753 B2 | 3/2016 | Smith | |
| 9,524,795 B2* | 12/2016 | Lee | G11C 17/16 |
| 2019/0043597 A1 | 2/2019 | Miyatake | |

* cited by examiner

|    | READ | PROGRAM | PROGRAM INHIBIT (same WL) | PROGRAM INHIBIT (other WL) | Alternative PROGRAM | Alternative INHIBIT (same WL) | Alternative INHIBIT (other WL) |
|----|------|---------|---------------------------|----------------------------|---------------------|-------------------------------|--------------------------------|
| RL | 0 | VPGM | VPGM | VPGM | HV1 | HV1 | HV1 |
| PL | 0 | VPGM | VPGM | 0 | HV2 | HV2 | 0 |
| CL | VREAD | VPGM | VPGM | 0 | VPGM | VPGM | 0 |
| WL | VDD | VDD | VDD | 0 | HV3 | HV3 | 0 |
| BL | Read Data | 0 | VDD | 0/VDD | 0 | HV3 | 0/HV3 |

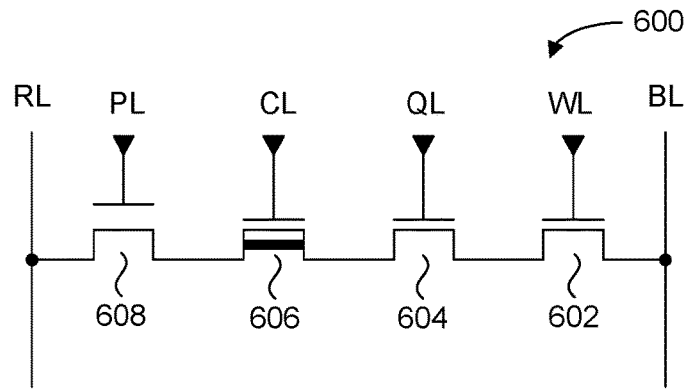
FIG. 10A
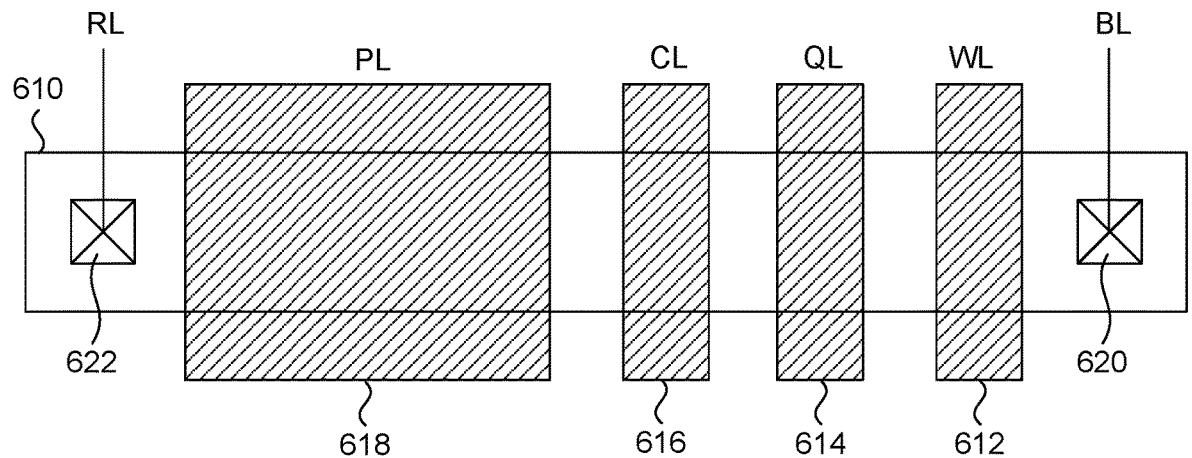
FIG. 10B
|  | READ | PROGRAM | PROGRAM INHIBIT (same WL) | PROGRAM INHIBIT (other WL) | Alternative PROGRAM | Alternative INHIBIT (same WL) | Alternative INHIBIT (other WL) |
|---|---|---|---|---|---|---|---|
| RL | 0 | VPGM | VPGM | VPGM | HV1 | HV1 | HV1 |
| PL | 0 | VPGM | VPGM | VPGM | HV2 | HV2 | HV2 |
| CL | VREAD | VPGM | VPGM | VPGM | VPGM | VPGM | VPGM |
| QL | VDD | VDD | VDD | VDD | HV3 | HV3 | HV3 |
| WL | VDD | VDD | VDD | 0 | VDD | VDD | 0 |
| BL | read data | 0 | VDD | VDD or 0 | 0 | VDD | VDD or 0 |
FIG. 10C

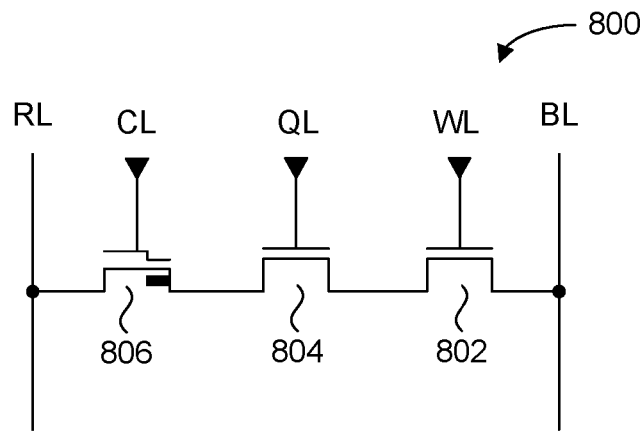
FIG. 12A
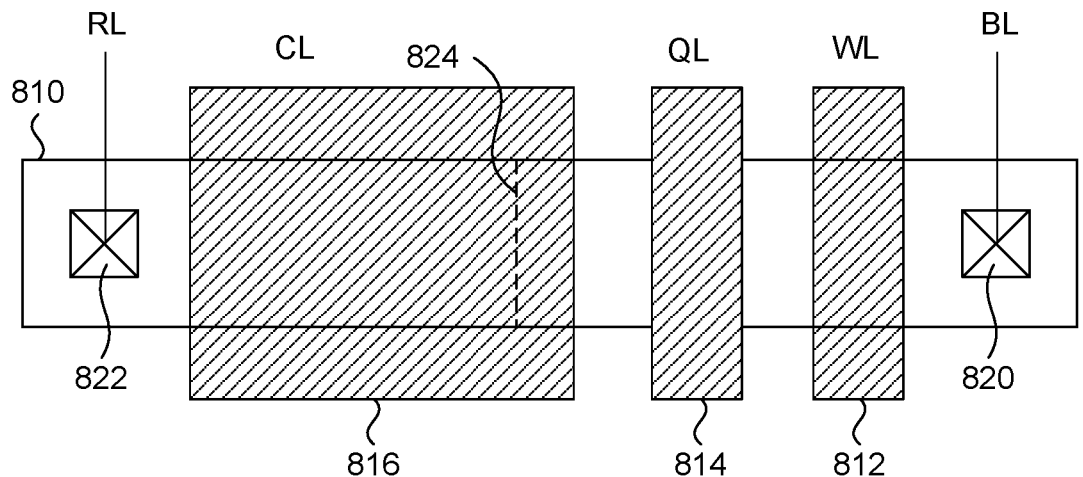
FIG. 12B
|  | READ | PROGRAM | PROGRAM INHIBIT (same WL) | PROGRAM INHIBIT (other WL) | Alternative PROGRAM | Alternative INHIBIT (same WL) | Alternative INHIBIT (other WL) |
|---|---|---|---|---|---|---|---|
| RL | 0 | VPGM | VPGM | VPGM | HV1 | HV1 | HV1 |
| CL | VREAD | VPGM | VPGM | VPGM | VPGM | VPGM | VPGM |
| QL | VDD | VDD | VDD | VDD | HV3 | HV3 | HV3 |
| WL | VDD | VDD | VDD | 0 | VDD | VDD | 0 |
| BL | read data | 0 | VDD | VDD or 0 | 0 | VDD | VDD or 0 |
FIG. 12C Global (UN-Decoded) CL
Decode PL Lines
Inhibit: BL = HV1

|    | Read      | Read Inhibit same WL | Read Inhibit other WL | Program | Program Inhibit same WL | Program Inhibit other WL |
|----|-----------|----------------------|-----------------------|---------|-------------------------|--------------------------|
| RL | VDD       | VDD                  | VDD                   | HV1     | HV1                     | HV1                      |
| PL | 0         | 0                    | VDD                   | 0       | 0                       | HV1                      |
| CL | VDD       | VDD                  | VDD                   | VPGM    | VPGM                    | VPGM                     |
| WL | VDD       | VDD                  | 0                     | HV1     | HV1                     | 0                        |
| BL | Read data | VDD                  | VDD or 0              | 0       | HV1                     | HV1 or 0                 |

FIG. 16D

Global (UN-Decoded) CL and PL
Inhibit Through Dynamic PL Precharge
Inhibit: BL = HV1

|     | Read Precharge | Read | Read Inhibit other WL | Read Inhibit other WL | Program Precharge | Program | Program Inhibit same WL | Program Inhibit other WL |
|-----|----------------|------|-----------------------|-----------------------|-------------------|---------|-------------------------|--------------------------|
| RL  | VDD            | VDD  | VDD                   | VDD                   | HV1               | HV1     | HV1                     | HV1                      |
| PL  | VDD            | 0    | 0                     | 0                     | HV1               | 0       | 0                       | 0                        |
| CL  | VDD            | VDD  | VDD                   | VDD                   | VPGM              | VPGM    | VPGM                    | VPGM                     |
| WL  | 0              | VDD  | VDD                   | 0                     | 0                 | HV1     | HV1                     | 0                        |
| BL  | VDD or 0       | Read data | VDD              | VDD or 0              | HV1               | 0       | HV1                     | HV1 or 0                 |

FIG. 17D

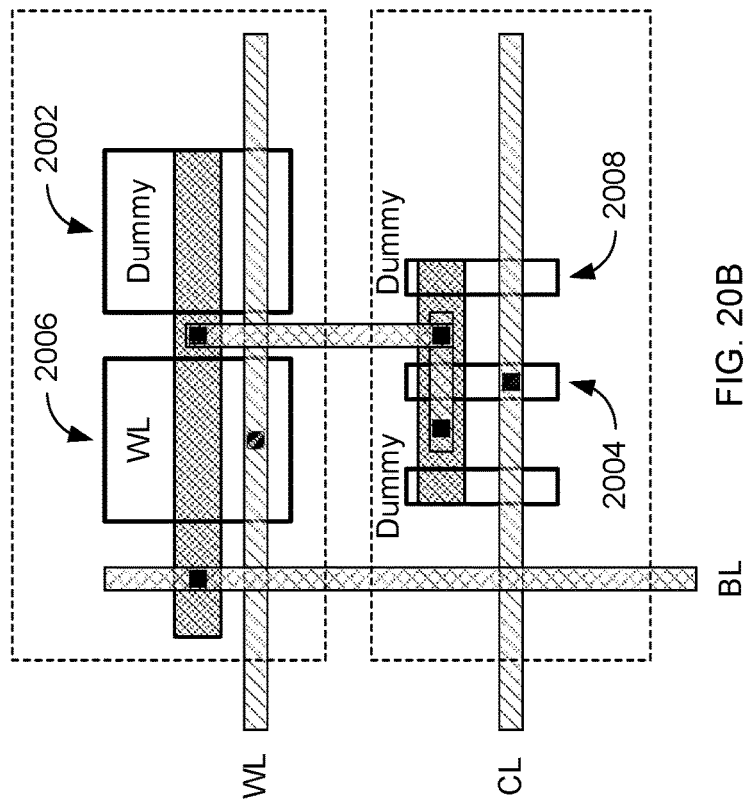
FIG. 20B
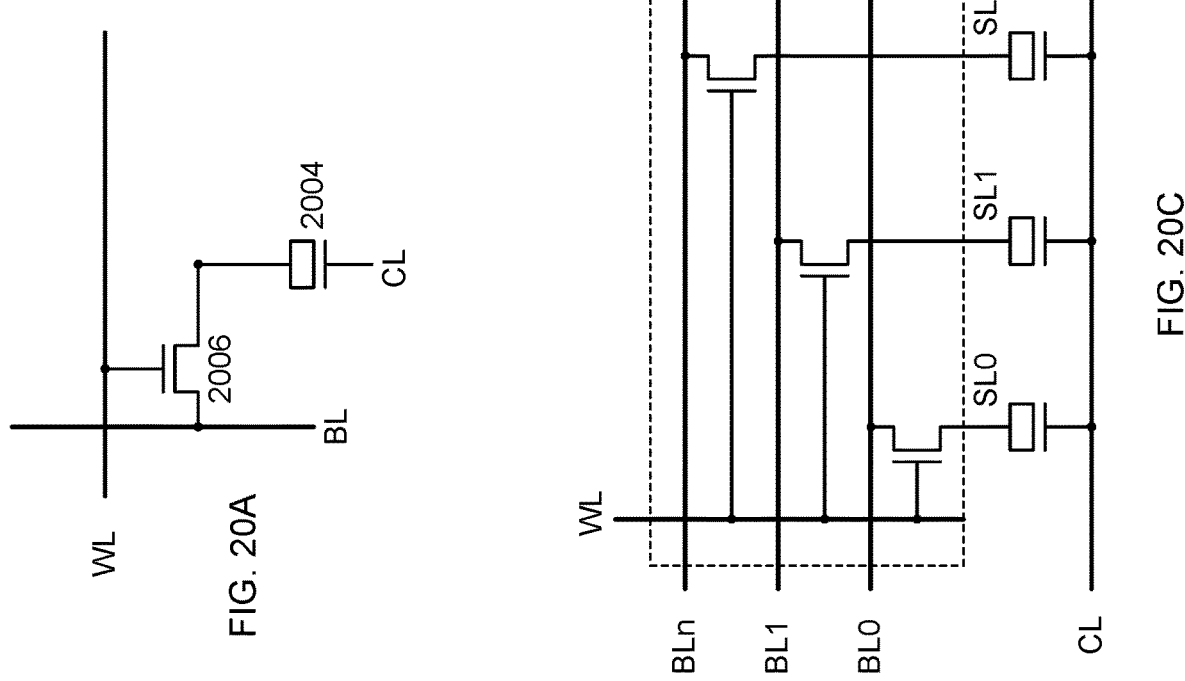
FIG. 20A
FIG. 20C

ONE TIME PROGRAMMABLE (OTP) BIT CELL WITH INTEGRATED INHIBIT DEVICE

CROSS REFERENCE TO RELATED APPLICATIONS

This application claims the benefit of U.S. Provisional Application No. 62/715,614, filed Aug. 7, 2018, which is incorporated by reference in its entirety.

BACKGROUND

The invention is directed to non-volatile memories. More specifically, the invention is directed to one-time programmable (OTP) memory cells and memory devices.

Anti-fuse memory is one type of one-time programmable (OTP) memory in which the device can be permanently programmed (electrically) with data once. This data is programmed by an end user for a particular application. There are several types of OTP memory cells which can be used. OTP memories provide users with a level of flexibility since any data can be programmed.

Anti-fuse memory can be utilized in one-time programmable applications where it is desired to provide pre-programmed information to a system, in which the information cannot be modified. One example application includes radio frequency identification (RF-ID) tags. RF-ID tagging applications are gaining more acceptance in the industry, particularly in sales, security, transport, logistics, and military applications for example. The simplicity and full complementary metal-oxide-semiconductor (CMOS) compatibility of anti-fuse memory allows for application of the RF-ID tag concept to integrated circuit manufacturing and testing processes.

FIG. 1A is a circuit diagram illustrating the basic concept of an anti-fuse memory cell, while FIGS. 1B and 1C show the planar and cross-sectional views respectively, of the anti-fuse memory cell shown in FIG. 1. The memory cell of FIG. 1 includes a pass, or access transistor 10 for coupling a bitline BL to a bottom plate of anti-fuse device 12. This cell is also referred to as a 1.5-transistor (1.5T) cell. A wordline WL is coupled to the gate of access transistor 10 to turn it on, and a cell plate voltage CL (program/read control line) is coupled to the top plate of anti-fuse device 12 for programming anti-fuse device 12.

It can be seen from FIGS. 1B and 1C that the layout of access transistor 10 and anti-fuse device 12 is very straightforward and simple. The gate 14 of access transistor 10 and the top plate 16 of anti-fuse device 12 are constructed with the same layer of material, such as polysilicon or metal, which extend across active area 18. In the active area 18 underneath each gate is formed a thin gate oxide 20 (or gate dielectric), for electrically isolating the gate from the active area underneath. The thin gate oxide 20 can be the same thickness underneath both gates 14 and 16, or can be made thicker under gate 14. On either side of gate 14 are diffusion regions 22 and 24, where diffusion region 24 is coupled to a bitline. Although not shown, those of skill in the art will understand that standard CMOS processing, such as sidewall spacer formation, lightly doped drains (LDD) and diffusion and gate silicidation, can be applied. While the classical single transistor and capacitor cell configuration is widely used, a transistor-only anti-fuse cell is further desirable due to the semiconductor array area savings that can be obtained for high-density applications. Such transistor-only anti-fuses must be reliable while simple to manufacture with a low-cost CMOS process.

FIG. 2A shows a cross-sectional view of an anti-fuse transistor that can be manufactured with any standard CMOS process. Variants of this anti-fuse transistor are described in U.S. patent application Ser. No. 11/762,552, filed on Jun. 13, 2007, now issued as U.S. Pat. No. 7,755,162, the contents of which are incorporated by reference. In the presently shown example, the anti-fuse transistor is almost identical to a simple thick gate oxide, or input/output metal oxide semiconductor (MOS) transistor. The disclosed anti-fuse transistor, also termed a split-channel capacitor or a split-channel transistor, can be reliably programmed such that the fuse link between the polysilicon gate and the substrate can be predictably localized to a particular region of the device. The cross-section view of FIG. 2A is taken along the channel length of the device, which in the presently described example is a p-channel device.

Anti-fuse transistor 26 includes a variable thickness gate oxide 28 formed on the substrate channel region 30, a polysilicon or metal gate 32, sidewall spacers 34, a field oxide region 36 such as shallow trench isolation for example, a diffusion region 38 and a LDD region 40 in the diffusion region 38. LDD region 40 is a high voltage LDD, meaning that it is formed using whatever process parameters are used for forming high voltage transistors and corresponding diffusion regions and LDDs. A bitline contact 42 is shown to be in electrical contact with diffusion region 38. The variable thickness gate oxide 28 includes a thick oxide and a thin gate oxide such that a portion of the channel length is covered by the thick gate oxide and the remaining portion of the channel length is covered by the thin gate oxide. Generally, the thin gate oxide is a region where oxide breakdown can occur, and forms the anti-fuse device portion of anti-fuse transistor 26 that functions as anti-fuse device 12 of the cell of FIG. 1B. The thicker portion of variable thickness gate oxide 28 forms the access transistor portion of anti-fuse transistor 26 that functions as access transistor 10 of the cell of FIG. 1B. This cell is also referred to as a 1 transistor (1T) cell. The thick gate oxide edge meeting diffusion region 38 on the other hand, defines an access edge where gate oxide breakdown is prevented and current between the gate 32 and diffusion region 38 is to flow for a programmed anti-fuse transistor. While the distance that the thick oxide portion extends into the channel region depends on the mask grade, the thick oxide portion is preferably formed to be at least as long as the minimum length of a high voltage transistor formed on the same chip.

In this example, the diffusion region 38 is connected to a bitline through a bitline contact 42, or other line for sensing a current from the polysilicon gate 32, and can be doped to accommodate programming voltages or currents. This diffusion region 38 is formed proximate to the thick oxide portion of the variable thickness gate oxide 28. Diffusion region 38 can be doped for low voltage transistors or high voltage transistors or a combination of the two resulting in same or different diffusion profiles.

A simplified plan view of the anti-fuse transistor 26 is shown in FIG. 2B. Bitline contact 42 can be used as a visual reference point to orient the plan view with the corresponding cross-sectional view of FIG. 2A. The active area 44 is the region of the device where the channel region 30 and diffusion region 38 are formed, which is defined by an OD (oxide diffusion) mask during the fabrication process. The dashed outline 46 defines the areas in which the thick gate oxide is to be formed via a second oxide diffusion (OD2)

mask during the fabrication process. More specifically, the area enclosed by the dashed outline 46 designates the regions where thick oxide is to be formed. An oxide definition mask (or Active Area), is used during the CMOS process for defining the regions on the substrate where the oxide is to be formed. An OD2 mask refers to a second oxide definition mask different than the first (Dual Gate, or Thick Gate oxide mask). Details of the CMOS process steps for fabricating anti-fuse transistor 26 are discussed in previously mentioned U.S. Pat. No. 7,755,162. In one embodiment, the thin gate oxide area bounded by edges of the active area 44 and the rightmost edge of the OD2 mask is minimized. In the presently shown embodiment, this area can be minimized by shifting the rightmost OD2 mask edge towards the parallel edge of active area 44. Previously mentioned U.S. Pat. No. 7,755,162 describes alternate single transistor anti-fuse memory cells which can be used in a non-volatile memory array.

FIG. 2C is a circuit diagram symbol representing anti-fuse transistor 26 of FIGS. 2A and 2B, with annotations showing the connections to a wordline WL and a bitline BL when used in a memory array.

Memories such as OTP memory are used in an increasing number of mobile devices, including smart phones, wearable technologies and other electronic devices that make up the Internet of Things (IoT). Unfortunately, mobile devices have a finite power supply which is consumed quickly as more functionality is added to them. Accordingly, all semiconductor devices of mobile devices should consume a minimum amount of power, and OTP memory are no exception. This lower power requirement of device manufacturers manifests primarily in the form of lowering the operating voltage of the OTP memory device. Furthermore, wearable devices are intended to be small, therefore the area of the OTP memory should be reduced as well in order to facilitate integration with other devices of the mobile system. Not only should the devices use low power and be small in size, they must also operate reliably. For example, the OTP memory should accurately store the data intended to be programmed to it.

Previously implemented memory devices utilizing the anti-fuse memory cells shown in FIGS. 1A-1C and 2A-2C have efficient memory arrays, meaning that the area occupied by the memory array is small when compared to the number of bits the memory array can store. However, high voltages are required to program an anti-fuse memory cell. Therefore, a large proportion of the memory device chip, or instance/macro if embedded in a larger system, is occupied by level shifters and high voltage transistors which have large dimensions relative to low voltage core logic transistors.

BRIEF DESCRIPTION OF DRAWINGS

Embodiments of the present disclosure will now be described, by way of example only, with reference to the attached Figures.

FIG. 10A is a circuit schematic of an anti-fuse memory cell with integrated write disturb inhibit device, according to another embodiment;

FIG. 10B is a plan view of the anti-fuse memory cell shown in FIG. 10A;

FIG. 10C is a table summarizing example read and program voltages used for the anti-fuse memory cell shown in FIGS. 10A and 10B;

FIG. 12A is a circuit schematic of an anti-fuse memory cell with integrated write disturb inhibit device, according to another embodiment;

FIG. 12B is a plan view of the anti-fuse memory cell shown in FIG. 12A;

FIG. 12C is a table summarizing example read and program voltages used for the anti-fuse memory cell shown in FIGS. 12A and 12B;

FIG. 16D is a table summarizing example read and program voltages used for the anti-fuse memory cell shown in FIG. 16A;

FIG. 17D is a table summarizing example read and program voltages used for the anti-fuse memory cell shown in FIG. 17A;

FIG. 20A is a circuit schematic of a third alternative FinFet anti-fuse memory cell with integrated write disturb inhibit device; and FIG. 20B is a plan view of the anti-fuse memory cell shown in FIG. 20A.

FIG. 20C shows a memory word implemented with the bit cell of FIGS. 20A-B.

DETAILED DESCRIPTION

Embodiments are directed to a low voltage anti-fuse memory cell with an integrated active precharge device which reduces write disturb to non-selected memory cells where programming is not desired, during programming the selected memory cell connected to the same line carrying a programming voltage. The anti-fuse device can be formed with the same process as the regular core devices, but preferably using shorter channel length and lower threshold voltage (Vt) if available in the process. A longer channel precharge transistor connected to the anti-fuse device can provide a small current to the anti-fuse device during programming to raise the voltage of the channel region for non-selected memory cells. This current is disabled or is overpowered in selected memory cells so that formation of a conductive link can occur when programming of the cell is desired.

A brief overview of how the anti-fuse memory cells shown in 1A-1C and 2A-2C are programmed and read now follows.

Figure 1A:
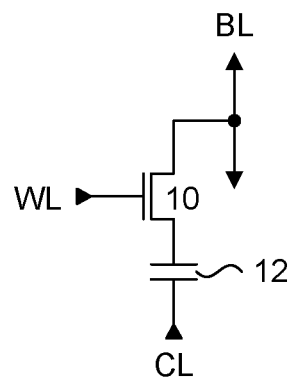
FIG. 1A is a circuit diagram of a 1.5T anti-fuse memory cell of the prior art.
Figure 2A:
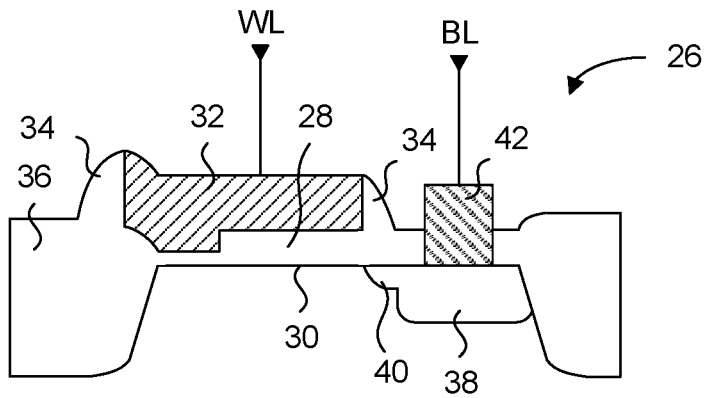
FIG. 2A is a cross-sectional view of a variable thickness gate oxide anti-fuse transistor of the prior art.
Figures 3A, 3B:
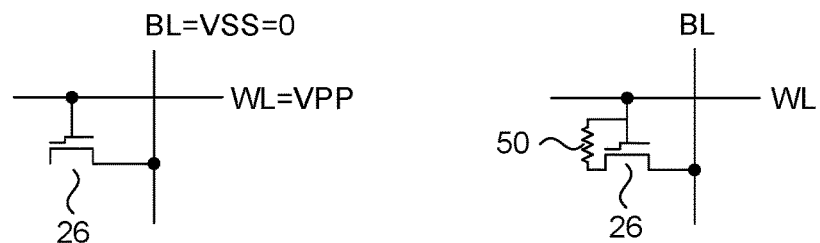
FIGS. 3A, 3B and 3C show anti-fuse transistor symbols.
Figure 3C:
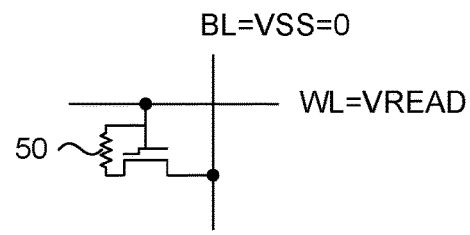

FIG. 3A is a schematic showing the interconnection of the previously described anti-fuse transistor 26 to a bitline and a wordline in a memory array. FIG. 3A assumes the device is an N channel device. Programming conditions are shown in FIG. 3A in which the bitline BL is biased or pre-charged to 0V while the wordline is driven to the VPP programming voltage. A successfully programmed anti-fuse transistor 26 is shown in FIG. 3B, where a conductive link 50 is formed in the gate oxide between the gate and the channel region. The thin gate oxide of the anti-fuse device (for both FIGS. 1A and 2A) is intended to breakdown in the presence of a large electrical field between the gate and the channel area during a programming operation, thereby creating an electrically conductive connection between the channel and gate. This electrically conductive connection can be referred to as the conductive link. Conductive link 50 is schematically represented as a resistive connection between the wordline and the channel region under the thin gate oxide region of anti-fuse transistor 26.

Therefore, a programmed anti-fuse transistor having a conductive link stores one logic state of one bit of data. An unprogrammed anti-fuse transistor will by default store the other logic state of one bit of data. To prevent programming of the anti-fuse transistor 26, the bitline is biased to a program inhibit voltage, which in one embodiment is VDD, while the wordline is driven to a programming voltage, which in one embodiment is VPP. Under such biasing conditions, the voltage level of channel region will increase to a level that is sufficient for inhibiting a conductive link from forming because the electrical field strength between the gate and the channel region is reduced. Programming of the anti-fuse memory cell of FIG. 1B is done similarly except that the Control Line CL is driven to VPP and worldine WL is driven to a positive voltage level.

Figure 1B:
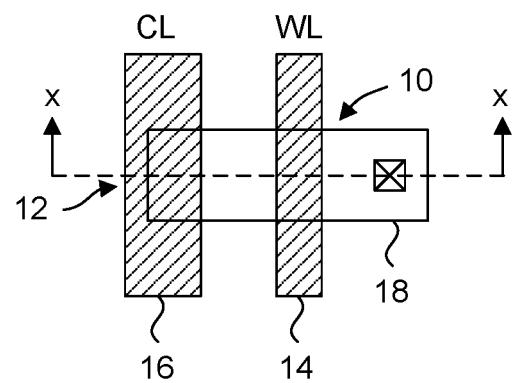
FIG. 1B is a planar layout of the anti-fuse memory cell of FIG. 1A.
Figure 1C:
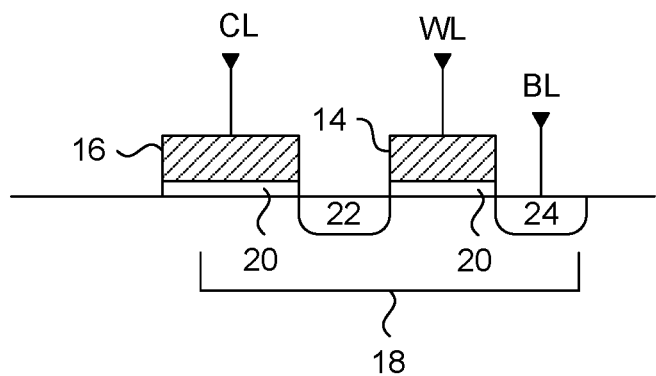
FIG. 1C is a cross-sectional view of the anti-fuse memory cell of FIG. 1B along line x-x.
Figure 2B:
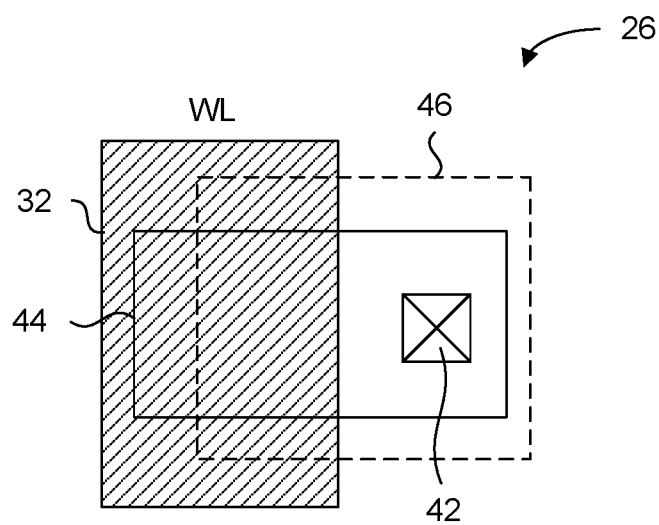
FIG. 2B is a planar layout of the variable thickness gate oxide anti-fuse transistor of FIG. 2A.
Figure 2C:
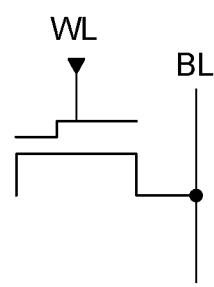
FIG. 2C is a simplified circuit schematic symbol of the variable thickness gate oxide anti-fuse transistor of FIGS. 2A and 2B.

Reading the anti-fuse transistor of FIG. 2C is achieved by driving the wordline to a read voltage VREAD, and by precharging the bitline to VSS. If the anti-fuse transistor 26 has a conductive link 50, then the wordline will pull the bitline towards the VREAD voltage level via the conductive link 50 and the positive gate voltage of the anti-fuse transistor. This bitline voltage can be sensed and amplified by sense amplifier circuits. On the other hand, if the anti-fuse transistor 26 is not programmed, i.e. does not have a conductive link 50, then the bitline will remain at approximately VSS. Reading of the anti-fuse memory cell of FIG. 1B is done similarly except that CL is driven to VREAD and WL is driven to a positive voltage.

For both types of cells, the VREAD voltage level may be at least the threshold voltage of the anti-fuse memory cell of FIG. 1B. In these cells, the amount of current a programmed anti-fuse device can provide during a read operation should be as large as possible to enable reliable sensing. However, low voltage applications may not permit increasing the voltage applied to the gate of the anti-fuse device beyond a particular limit.

Figure 4:
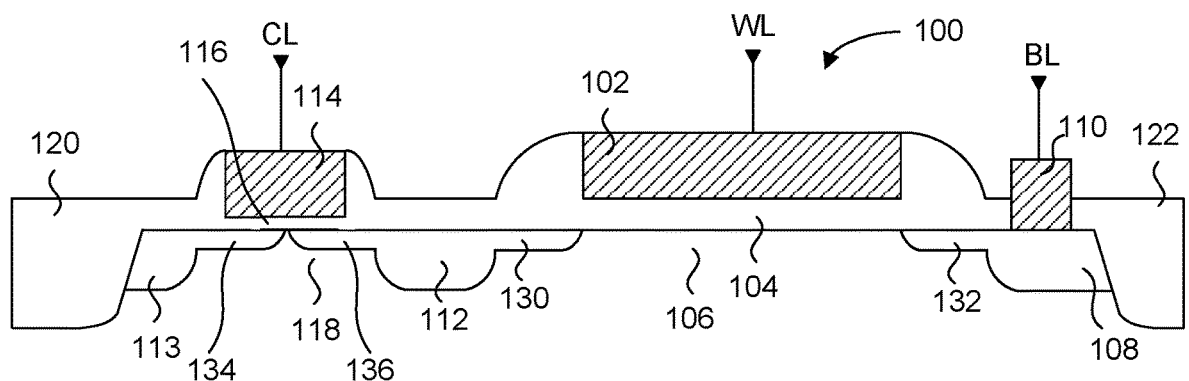
FIG. 4 is a cross-sectional view of a 2T anti-fuse memory cell, according to prior art.

The current of the anti-fuse device of the cells shown in FIG. 1B and FIG. 2B can be increased through a deeper LDD source/drain extension diffusion. For example, by replacing the core NMOS LDD with a high voltage or I/O oxide LDD, as shown in FIG. 4. FIG. 4 is a cross-sectional view of a 2T anti-fuse memory cell 100, which includes an access transistor in series with an anti-fuse device. It is noted that the structures shown in FIG. 4 is not shown exactly to scale, and is intended to show the relative locations of the illustrated features. The access transistor includes a gate 102 overlying a thick gate oxide 104, which itself is formed over the channel 106. On the right side of the channel 106 is a diffusion region 108 doped for a high voltage transistor electrically connected to a bitline contact 110. On the left side of the channel 106 is a common diffusion region 112 doped for a high voltage transistor shared with the anti-fuse device. This common diffusion region 112 functions to electrically couple the channel regions 118 and 106 to each other. The anti-fuse device includes a gate 114 overlying a thin gate oxide 116, which itself is formed over a channel 118. Another diffusion region 113 doped for a high voltage transistor is formed on the left side of gate 114. The thick gate oxide 104 may correspond to that used for high voltage transistors while the thin gate oxide 116 may correspond to that used for low voltage transistors. Gate 102 may be coupled to a wordline WL while gate 114 may be coupled to a controlled voltage CL. Thick field oxide, or shallow trench isolation (STI) oxide 120 and 122 are formed for isolating the memory cell from other memory cells and/or core oxide devices. The core oxide devices, which form logic circuits for example, are considered low voltage transistors and hence made with thin gate oxides (core oxides) and with low voltage LDD's. U.S. patent application Ser. No. 11/762,552 filed on Jun. 13, 2007, and issued as U.S. Pat. No. 7,755,162 describes alternate two-transistor anti-fuse memory cells which can be used in a non-volatile memory array.

Some embodiments, the substrate, which may include a well, is P type, and diffusion regions 108 and 112 are N type. In the channel region of the anti-fuse device, at least one high voltage LDD is implanted in the channel area underneath the thin gate oxide 116. In the example of FIG. 4, two high voltage LDD's 134 and 136 are implanted in the anti-fuse device channel region.

In some embodiments, a low voltage LDD is implanted adjacent the channels of low voltage transistors and a different high voltage LDD is implanted adjacent the channels of high voltage transistors. An LDD is a structure used in transistor devices to reduce hot electron effects where electrons can gain high levels of energy due to the electric field between the diffusion region and the gate, and thereby tunnel into the gate oxide where they become trapped and can adversely change the threshold voltage and the current/voltage (IV) characteristics of the transistor device. The LDD is a shallow area adjacent to diffusion region having a doping that is significantly less than the diffusion region and has the effect of decreasing the field between the diffusion region and the channel and thus hot electron effects. The LDD concentration or doping for high voltage transistors differs from that of low voltage transistors, as it is designed to reduce the hot electron effect at higher operating voltages, resulting in longer lateral diffusion compared to low voltage LDD.

In the example of FIG. 4, the anti-fuse device channel length is more than 2 times the high voltage LDD length. In the orientation of the drawing shown in FIG. 4, the length dimension corresponds to the horizontal dimension of the page. Accordingly, as shown in FIG. 4, high voltage LDD's 130 and 132 are formed in the channel proximate the thick gate oxide 104 and high voltage LDD's 134 and 136 are formed in the channel proximate the thin gate oxide 116. In the shown example, the high voltage LDD's 134 and 136 extend to cover almost entire channel length and width of the anti-fuse device.

When programmed in the manner as previously described, the conductive link formed in the thin gate oxide 116 forms an ohmic contact with the high voltage LDD's in the channel. Such an ohmic contact provides a lower resistance path when compared to the anti-fuse cell programmed to the channel area, allowing for lower read voltage. However, in a dual oxide CMOS process, the high voltage LDD depth, lateral diffusion, and doping levels are too low to form a uniform, highly doped region underneath entire width and length of the channel, resulting in wide spread of programmed cell characteristics.

Figure 5A:
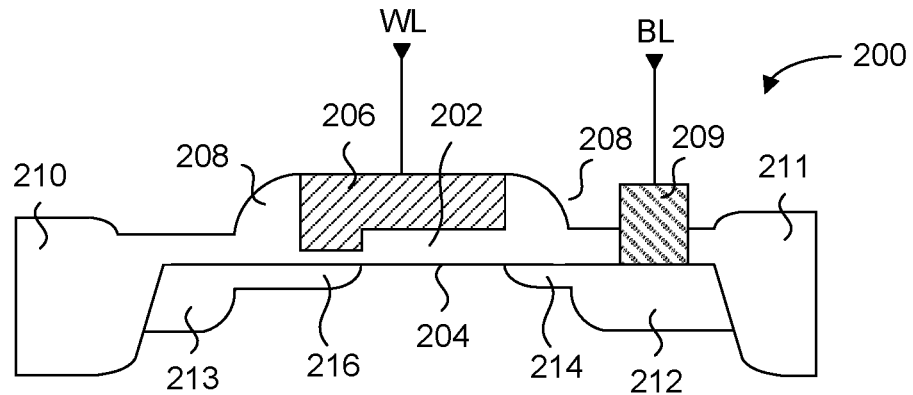
FIG. 5A is a cross-sectional view of a version of 1T anti-fuse memory cell, according to prior art.

FIG. 5A is a cross-sectional view of a 1T anti-fuse memory cell 200 (a split-channel transistor) having a high voltage LDD formed in the channel of the anti-fuse device. Anti-fuse memory cell 200 includes a variable thickness gate oxide 202 formed on the substrate channel region 204 having thick and thin oxide portions, a gate 206, sidewall spacers 208, field oxide regions 210 and 211 such as shallow trench isolation for example, and a diffusion region 212 doped for a high voltage transistor electrically connected to a bitline contact 209. Another diffusion region 213 doped for a high voltage transistor is formed to the left side of the variable thickness gate oxide 202. The portion of the gate 206 over the thick portion of oxide 202 functions as an access transistor, while the portion of the gate 206 over the thin portion of oxide 202 functions as an anti-fuse device.

Figure 5B:
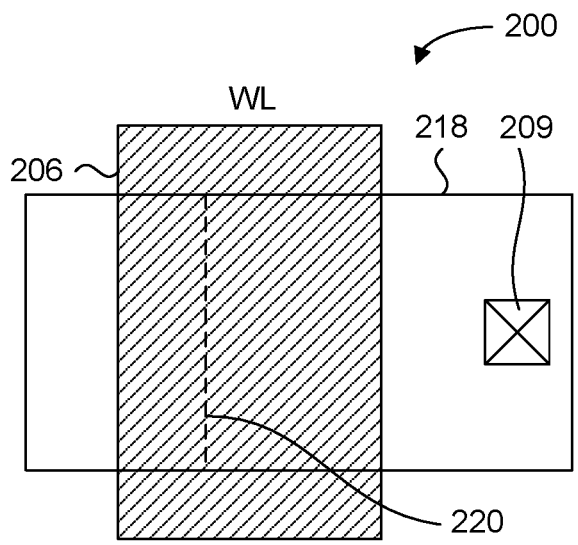
FIG. 5B is a plan view of the anti-fuse memory cell shown in FIG. 5A.

FIG. 5B is a plan view of anti-fuse memory cell 200 shown in FIG. 5A, where the high voltage LDD 216 not only extends the entire anti-fuse device channel length, but also the entire width of the anti-fuse device channel length. In the orientation of the drawing shown in FIG. 5B, the width dimension corresponds to the vertical dimension of the page. The channel length and width of the anti-fuse device is delineated by the active area border 218 underneath the gate 206. The dashed line 220 shows the transition area between the thin gate oxide and the gate oxide of variable thickness gate oxide 202. The thin gate oxide portion extends from the left vertical edge of border 218 to the dashed line 220 while the thick gate oxide portion extends from border 218 to the right vertical edge of gate 206. Accordingly, the high voltage LDD 216 is formed in the channel underneath the thin gate oxide portion which extends from the left vertical edge of border 218 to the dashed line 220.

Figure 5C:
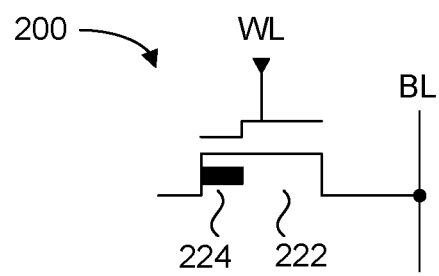
FIG. 5C is a circuit diagram symbol representing the anti-fuse memory cell shown in FIGS. 5A and 5B.

FIG. 5C is a circuit diagram symbol representing anti-fuse memory cell 200 shown in FIGS. 5A and 5B, where the access transistor is shown by reference number 222 and the anti-fuse device having the high voltage LDD is shown by reference number 224. The black bar appearing in the symbol indicates the presence of the high voltage LDD in the channel of the anti-fuse device. The present embodiment of the anti-fuse memory cell 200 shows an anti-fuse device having a diffusion region 213 that is not electrically coupled to any other structure. As will be shown in further alternate embodiments, this diffusion region 213 can be connected to another transistor device. The cell from FIGS. 5A-5C suffers from the same drawbacks as the cell from FIG. 4, as the doping profile underneath the gate is not uniform enough to produce low resistivity link after programming.

Figure 6:
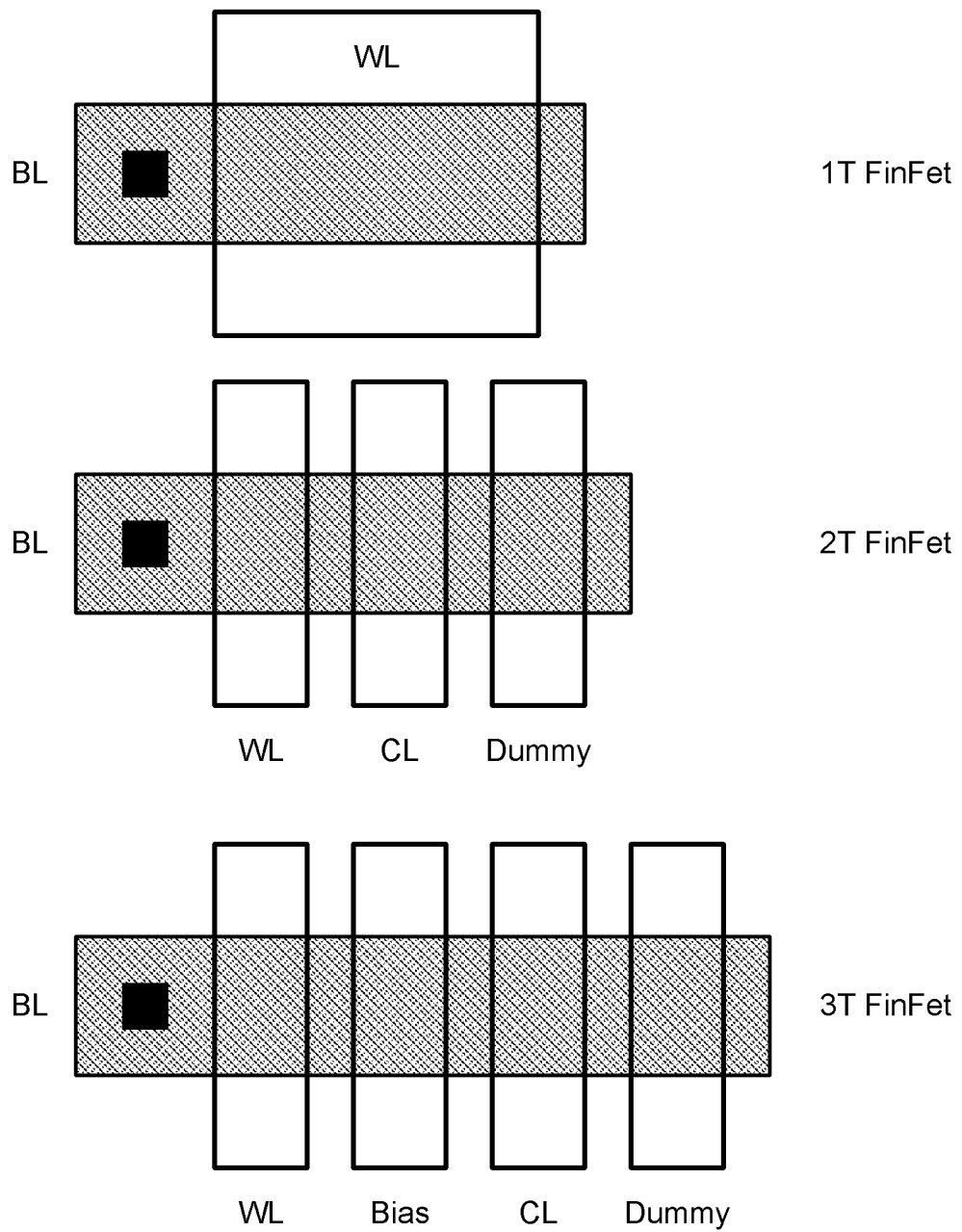
FIG. 6 is a plan view of 1T, 2T and 3T prior art bit cell implementations in FinFet technology.

FIG. 6 depicts various versions of the prior art OTP cells 1T, 2T and 3T implemented in FinFet technology. These cells operate similarly to previously described cells and suffer from the same drawbacks. The programmed state resistance strongly depends on the doping profile in the channel area.

Figure 7:
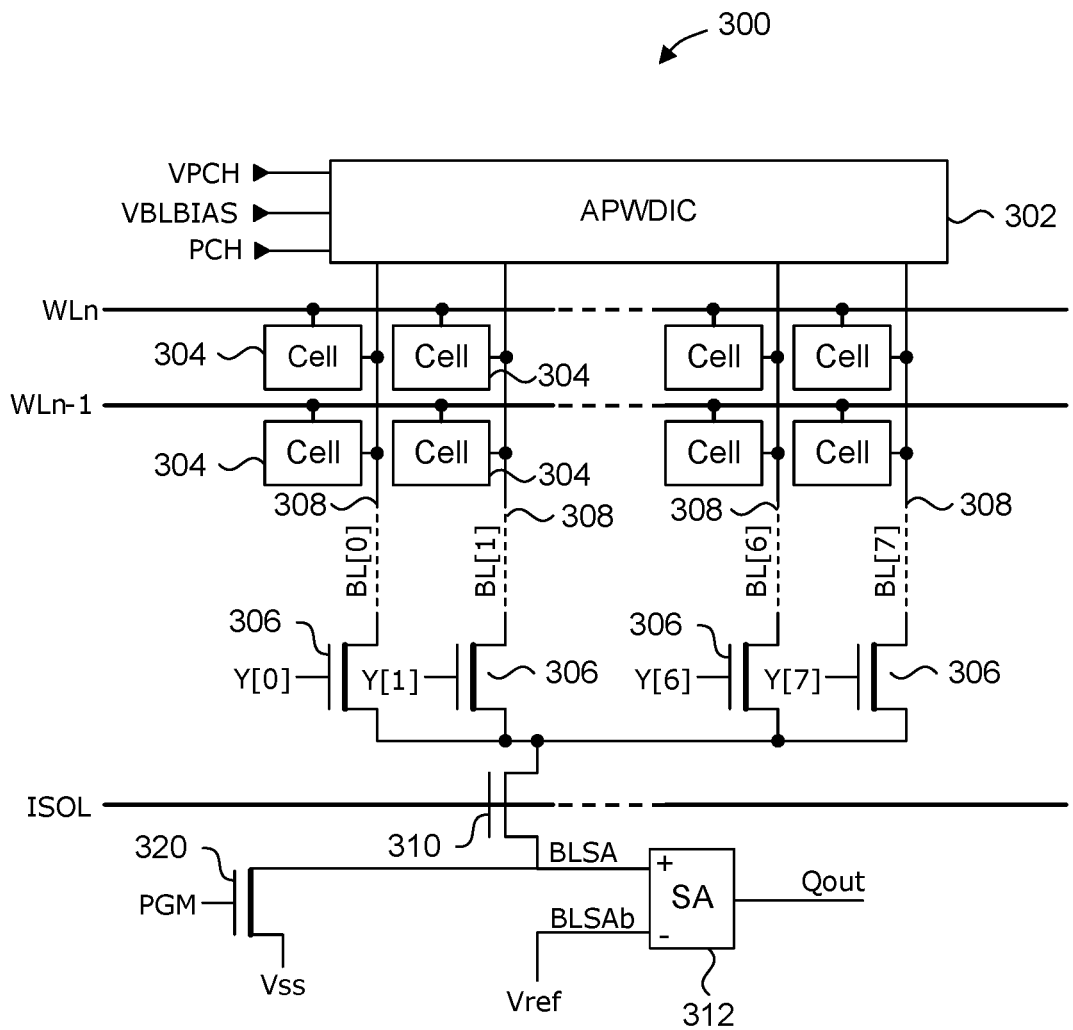
FIG. 7 is a schematic of a prior art nonvolatile memory including an active precharge circuit.

An example memory array is shown in FIG. 7, which was previously disclosed in U.S. Pat. No. 9,275,753, titled "Circuit and Method for Reducing Write Disturb in a Non-Volatile Memory Device, which is hereby incorporated by reference in its entirety.

FIG. 7 is a simplified circuit schematic of a nonvolatile memory 300 including an active precharge circuit, herein referred to as active precharge write disturb inhibit circuit (APWDIC) 302. The nonvolatile memory 300 has a memory array of programmable anti-fuse memory cells 304 arranged in rows, or wordlines, and columns, or bitlines, configured for receiving a program enable voltage or a program inhibit voltage. The memory 300 further has column select devices 306 receiving column select signals Y[0] to Y[7] to couple a selected bitline 308 to line BLSA via an isolation device 310. The selected bitline 308 is biased by sense amplifier (SA) 312 (or by a PGM device 320) to the program enable voltage, if a memory cell 304 connected to the selected bitline 308 is to be programmed, or to the program inhibit voltage, if no memory cell 304 connected to the selected bitline 308 is to be programmed. In the programming operation, a selected wordline (WLn or WLn-1) is driven to a programming voltage level. Sense amplifier 312 has its other input connected to line BLSAb, which can be connected to a reference voltage Vref. Hence, sense amplifier 312 is configured for single ended sensing.

In the present example, the program enable voltage is VSS and the program inhibit voltage is VPCH. VPCH is a positive voltage level of about VCC-Vt, VPP-Vt, VPP, or any predetermined voltage sufficient for the purposes of inhibiting programming of a non-selected anti-fuse memory cell 304 connected to a selected wordline in the precharge and programming operations of a program cycle. The function of the APWDIC 302 is to connect to and maintain at the program inhibit voltage, all non-selected bitlines so as to inhibit programming of any memory cell 304 on that bitline 308. The APWDIC 302 is also configured to connect to and maintain at the program-inhibiting voltage, a selected bitline 308 which is not to be programmed. Accordingly, the memory cell 304 connected to the selected wordline at the programming voltage level and the bitline 308 at VSS will be programmed. Conversely, any memory cell 304 connected to the selected wordline and a bitline 308 at the program inhibit voltage of VPCH is inhibited from being programmed. The disclosure of U.S. Pat. No. 9,275,753 explains the function of control signal PCH and of controllable bias voltage VBLBIAS.

Memory 300 shows anti-fuse memory cells 304 generically as boxes. Each of these boxes can be implemented by either the previously described anti-fuse memory cells. In the 2T cell example of FIG. 4, CL and WL can be connected to each other, or an additional CL line running parallel to WL can be included if CL and WL are independently controlled.

Memory 300 uses high voltage transistor devices, such as column select devices 306, isolation device 310, and many devices in the active precharge write disturb inhibit circuit 302 (not shown). These high voltage transistors are significantly larger than core logic low voltage transistors and use up valuable chip area. The circuitry peripheral to the memory array including cells 304 greatly contributes to the overall chip area of memory 300. While not shown in FIG. 7, such further peripheral circuitry includes, in addition to those shown in FIG. 7, wordline drivers and level shifters to translate logic levels between different voltage domains.

In some embodiments, the OTP bit cell arrays occupy 20% of the OTP area, while the high voltage periphery occupies 60%, with the remaining 20% used for the low voltage control logic. In addition to large area consumption, the high voltage periphery uses a relatively high OTP read voltage, frequently above the range provided by the batteries in mobile and internet of things (IoT) applications. It is therefore advantageous to provide a low voltage OTP solution with reduced periphery area, and with improved write disturb immunity.

Therefore, a new anti-fuse memory cell is described which, in addition to providing other advantages, leads to a reduction in the overall OTP memory area.

According to the present embodiments, new types of anti-fuse memory cells are proposed which can avoid the use of an active precharge write disturb inhibit circuit 302 on each BL, while retaining the function of the active precharge write disturb inhibit circuit 302 and at the same time lowering the read voltage through improved bit cell programming performance. Although individual bit cell area increases relative to the previously described cells, implementation of these new types of anti-fuse memory cells in a memory device will reduce the overall memory device chip area footprint relative to a memory device of the same storage capacity which uses the high voltage WL drivers, or high voltage program line drivers and active precharge write disturb inhibit circuit 302 shown in FIG. 7.

According to the present embodiments, this new type of anti-fuse memory cell includes an anti-fuse device electrically coupled to a bitline via an access transistor, and a write disturb inhibit device electrically coupled to the anti-fuse device. The bitline can carry a program enable voltage to enable the selected anti-fuse device to program in the presence of a high electrical field between its gate and channel region. The bitline can further carry a program inhibit voltage which, when coupled to the selected anti-fuse device, prevents the anti-fuse device from being programmed. The write disturb inhibit device provides a small current during programming operations to maintain the channel region of the protected anti-fuse device at the program inhibit voltage in order to compensate for any leakage which could result in an unintended high field across the anti-fuse device gate. A driver device for providing the program enable voltage level on a bitline is configured to drive more current than the write disturb inhibit device, thereby removing the program inhibit voltage at least from one edge of the channel of the anti-fuse device and allowing it to be programmed.

Figure 8A:
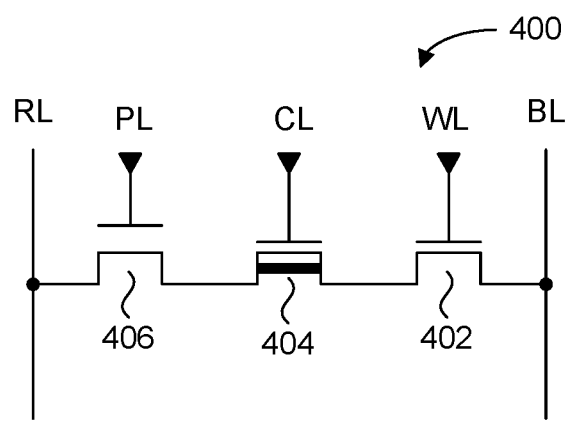
FIG. 8A is a circuit schematic of an anti-fuse memory cell with integrated write disturb inhibit device, according to a present embodiment.

FIG. 8A is a circuit diagram representing an anti-fuse memory cell 400 with integrated write disturb inhibit device. This cell includes an access transistor 402, an anti-fuse device 404, and a precharge transistor 406 connected in series between a bitline BL and precharge voltage line RL. This is an N-type memory device as the substrate channel is P-type and the diffusion regions and LDD regions are all N-type. While an N-type memory device is shown as an example, a P-type memory device is possible where the transistors 402, 406 and the anti-fuse device 404 are formed as P-type devices. The access transistor 402 has a gate connected to a wordline signal WL. The anti-fuse device 404 has a gate connected to a program line CL. The precharge transistor 406 has a gate connected to a precharge line PL. The anti-fuse device 404 is fabricated with a low voltage process, and accordingly, has a thin gate oxide which corresponds to those used in low voltage core logic circuitry formed on the same device. The precharge transistor 406 is fabricated with a high voltage process, and accordingly, has a thick gate oxide which corresponds to those used in high voltage transistors formed on the same device. This thick gate oxide is thicker than the gate oxide of the anti-fuse device 404. The access transistor 402 can be either a thick or thin oxide device, on yet another oxide device thickness in a triple gate oxide process. In the present example embodiment, anti-fuse device 404 includes a black bar which indicates the presence of a high voltage LDD in the channel thereof, but any other anti-fuse device type can be used.

Figure 8B:
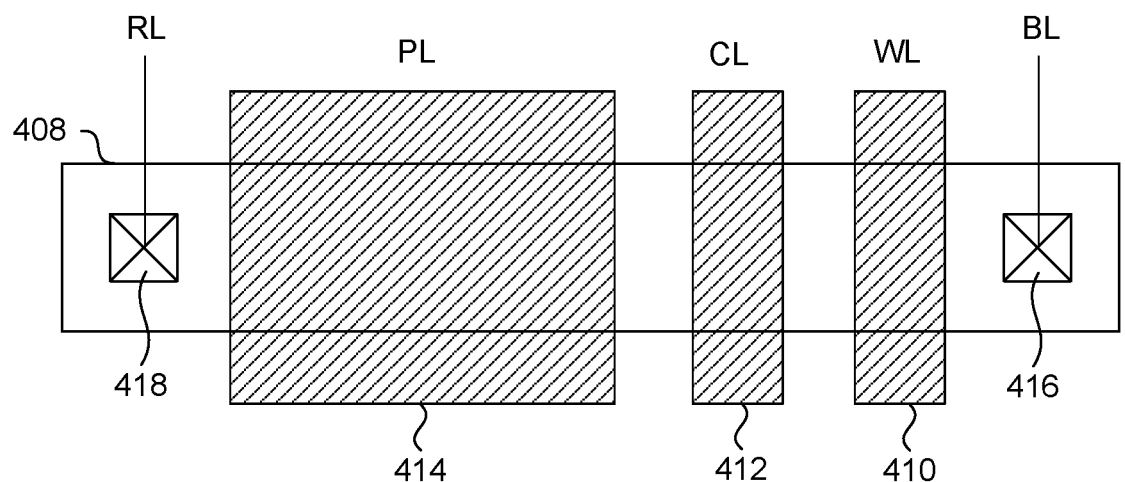
FIG. 8B is a plan view of the anti-fuse memory cell shown in FIG. 8A.

FIG. 8B is a plan view of anti-fuse memory cell 400 of FIG. 8A that shows the relative dimensions of the active area 408, and the gates 410, 412 and 414 of respective devices 402, 404 and 406, according to a present embodiment. Labels for WL, CL and PL indicate the signals to which the gates 410, 412 and 414 are connected. Contacts 416 and 418 are provided to allow for electrical connection to the bitline BL and the precharge voltage line RL. The length of gate 412 of the anti-fuse device 404 is set to be a minimum allowable by lithography process. The width and the length of gate 410 of the access transistor 402 can be designed to increase programming current while reducing overall leakage current in the array.

In contrast, precharge transistor 406 is configured as a long channel device, designed to limit precharge current while reducing overall bit cell area. For example, the gate of the precharge transistor 406 may be longer than its width, to limit the saturation current below 10-50 uA. Because the precharge transistor 406 is further fabricated with a thick gate oxide, a low-level current can be provided by the precharge transistor 406 to the anti-fuse device 404 with the proper combination of voltage applied by the precharge line PL and the precharge voltage line RL. In addition to a long channel and thick gate oxide, the precharge transistor 406 can be fabricated to have a high threshold voltage (Vt) ion implantation, or an ultra-thick gate oxide thicker than the thick gate oxide could be used if available in the process. The precharge transistor's Vt can be set as high as the process allows, even above the OTP read voltage level. For example, in a 1.8V CMOS process where the threshold voltage (Vt) of core oxide devices is approx. 0.5V, the Vt of the precharge transistor may be set to approx. 0.8V for the 3.3V IO oxide device, or may reach up to 2.5V for a 12V thick oxide precharge device. Any other transistor configuration that provides a small current may be used in place of precharge transistor 406. For example, a meandering or serpentine long channel can be used, or an LDD blocked device may be used. As will be shown later, the active area 408 may be varied in its width dimension to provide devices with different widths. The main purpose for such configurations of precharge transistor 406 is to limit the current therethrough to simulate a current leakage, which can be turned on and off by PL.

FIGS. 8C, 8D, 8E, and 8F show alternate embodiments of the anti-fuse memory cell 400 of FIG. 8B. The same reference numbers appearing in these figures refer to the same structures shown in FIG. 8B.

Figure 8C:
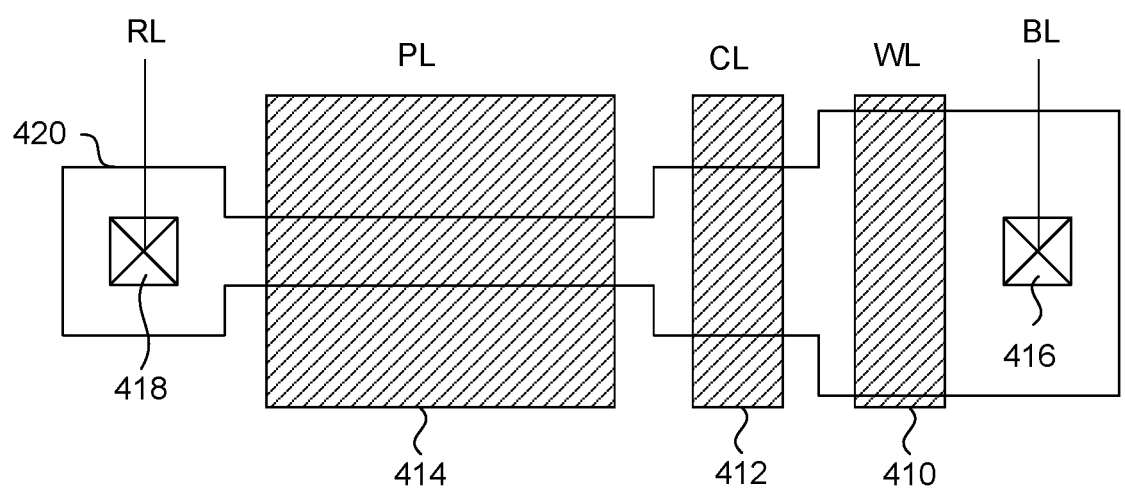
FIGS. 8C, 8D, 8E and 8F are alternate embodiments of the anti-fuse memory cell of FIG. 8B.
Figure 8D:
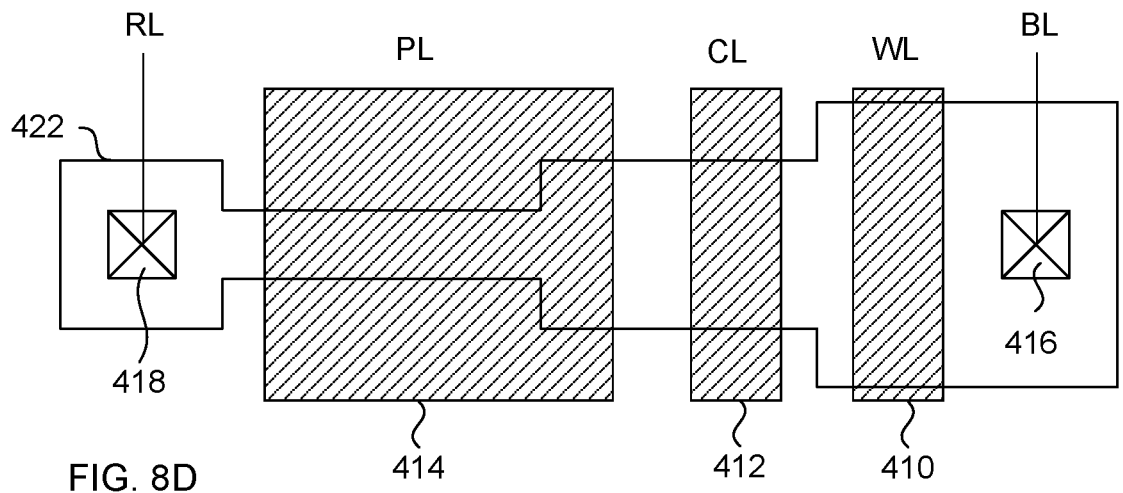

In FIG. 8C, the active area 420 is shaped such that the entire channel under gate 414 has a minimized width dimension, while the channel under gate 412 is wider than that for gate 414, and the channel under gate 410 is wider than that of gate 412. In a variant of this configuration shown in FIG. 8D, active area 422 is almost the same as active area 420 of FIG. 8C except that part of the channel under gate 414 has a minimized width dimension, which transitions to a wider width dimension that continues for the gate 412.

Figure 8E:
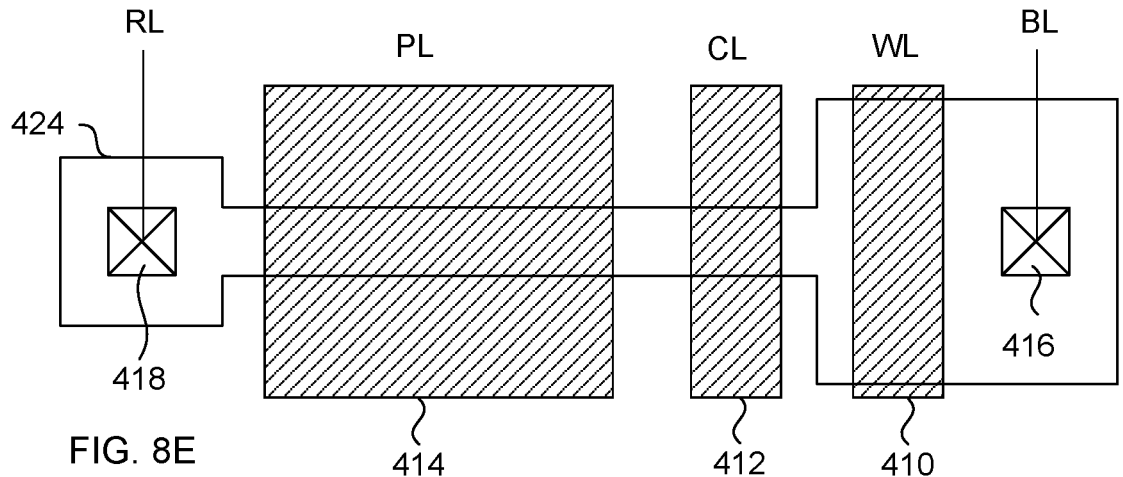

In FIG. 8E, the active area 424 is shaped such that the entire channel under both gates 414 and 412 have a minimized width dimension, while the channel under gate 410 is significantly wider and designed to provide a reduced programming current.

Figure 8F:
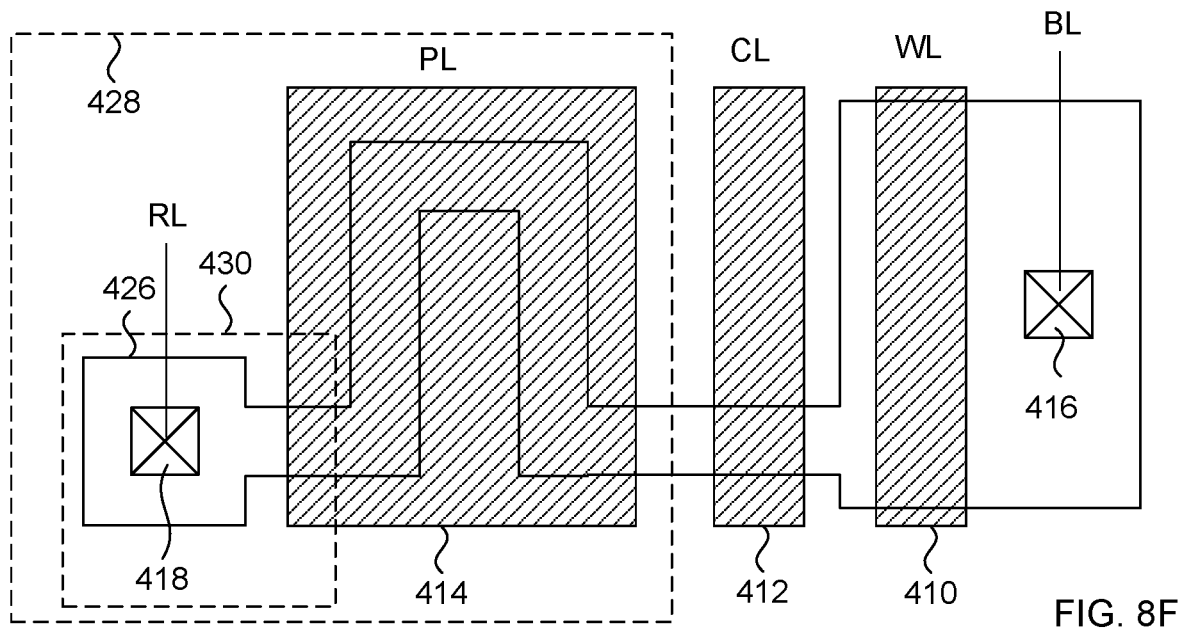

FIG. 8F shows an embodiment similar to FIG. 8E except the active area is shaped such that the channel under gate 414 has a minimum width dimension, but is serpentine to further extend the length dimension. Furthermore, the area outlined by the dashed box 428, and in particular the gate oxide under gate 414, is formed as an ultra-thick gate oxide with or without a high Vt implant. In a further embodiment, the dashed box 430 marks an area in which the drain does not include LDD implant.

The programming and read operation of anti-fuse memory cell 400 with integrated write disturb inhibit is now described with reference to the table shown in FIG. 8G that summarizes the read and program voltages for both operations. This table shows example voltages that would be applied to the terminals of the anti-fuse memory cell 400, to read a selected cell (READ column), to program a selected cell (PROGRAM column), and to inhibit programming of a non-selected cell (PROGRAM INHIBIT column). This table further shows alternate voltages which can be applied for programming a selected cell (Alternative PROGRAM column), and to inhibit programming of a non-selected cell (Alternative INHIBIT). The columns named "PROGRAM INHIBIT (same WL)" and "PROGRAM INHIBIT (other WL)" show that the PL, CL and WL voltages are different for a non-selected WL because PL and CL are selected at the same time with a corresponding WL. This arrangement is shown in FIG. 9. This is the same situation for the two columns named "Alternative INHIBIT (same WL)" and "Alternative INHIBIT (other WL)".

A discussion of the voltages in the PROGRAM column and the PROGRAM INHIBIT column now follows. In a programming operation, the precharge line PL and the precharge voltage line RL are both driven to a programming voltage of VPGM. These voltages are selected to provide a small current to anti-fuse device 404 to raise the voltage level of its channel to what is referred to as a blocking voltage level. This blocking voltage level will be sufficient to inhibit programming of anti-fuse device 404 upon application of the programming voltage to CL. Next, the bitline BL is biased to either a program enable voltage level or am inhibit voltage level based on the "write data" for the bitline BL. In some embodiments, VSS or 0V is the program enable voltage. The inhibited BLs may be driven to the VDD voltage level. Shortly thereafter, CL is driven to the programming voltage of VPGM, which is selected to enable formation of a conductive link in the anti-fuse device 404 if BL was driven to the program enable voltage. An advantage of this particular program scheme is that the BLs are never driven to a high inhibit voltage level and there are only 3 voltage levels that are required: VPGM, VDD and 0V.

In the alternative programming operation, the precharge line PL and the precharge voltage line RL are both driven to a high voltage level, referred to as HV1 and HV2 respectively. Both HV1 and HV2 are selected to provide a small current to anti-fuse device 404 to raise the voltage level of its channel to the blocking voltage level. This blocking voltage level will be sufficient to inhibit programming of anti-fuse device 404 upon application of the programming voltage to CL. Next, the bitline BL is biased to either a program enable voltage level or inhibited through biasing to WL enable voltage level HV3 based on the "write data" for the bitline BL. In some embodiment, VSS or 0V is the program enable voltage while HV3 is the bit cell WL access voltage. In one example, the WL access voltage HV3 can be VDD during read and a boosted voltage during programming to increase programming current. Shortly thereafter, CL is driven to the programming voltage of VPGM which is selected to enable formation of a conductive link in the anti-fuse device 404 if BL was driven to the program enable voltage. In the present example, if BL is biased to the program enable voltage level such as VSS, then the circuitry for pulling down BL to VSS is configured to overcome the current provided by precharge transistor 406 and the channel of anti-fuse device 404 will be at VSS. Hence, the anti-fuse device 404 can be programmed to form the conductive link in the thin gate oxide between the gate and the channel.

Otherwise, if BL is biased to the program inhibit voltage level, then the channel of anti-fuse device 404 will be held at the blocking voltage level by the RL voltage via precharge transistor 406. Hence, the anti-fuse device 404 is prevented from being programmed under these voltage conditions. It is noted that in the above described sequence, the access transistor 402 (having gate 410) will turn off due to the applied program inhibit voltage, wordline voltage level, and blocking voltage level of the anti-fuse device 404 (having gate 412).

Accordingly, there are situations in which the program inhibit voltage level applied to the bitline can leak, such as for example high temperature conditions of the device. In some implementations, the bitlines are precharged to the program inhibit voltage level first and are left to float. If the bitline program inhibit voltage leaks away, there is a possibility that the memory cells connected to it may program. This is referred to as write disturb. Therefore, the current provided by the precharge transistor 406 is configured to maintain the blocking voltage level in the channel of anti-fuse device 404 under the worst-case temperature condition of the memory device to prevent unintended programming regardless of what happens to the voltage on the bitline. The voltages of RL and PL can be selected in conjunction with the geometries of precharge transistor 406, to ensure a weak current is provided. Simulation, modelling, or testing of fabricated devices can be done to arrive at the suitable voltages. RL and PL should be applied for a minimum duration of time to allow the substrate of the anti-fuse device to precharge to the blocking voltage level before application of VPGM.

In a read operation, the bitline BL is precharged to VSS, RL and PL are held at VSS, CL is driven to VDD and the wordline WL is driven to a read voltage. If the anti-fuse device 412 includes a conductive link between its gate and the channel in the substrate, then the voltage of the bitline will rise for subsequent detection by sense amplifier circuitry indicating one logic state. Otherwise, the bitline voltage remains at or near VSS which is sensed as the opposite logic state.

According to an alternate embodiment of anti-fuse memory cell 400, the anti-fuse device 404 may be replaced with an identical device that does not have a high voltage LDD in the channel thereof. In such an embodiment, the pre-charging effect provided by precharge transistor 406 during programming would be the same as previously described above for the embodiment of memory cell 400.

Figures 8G, 9:
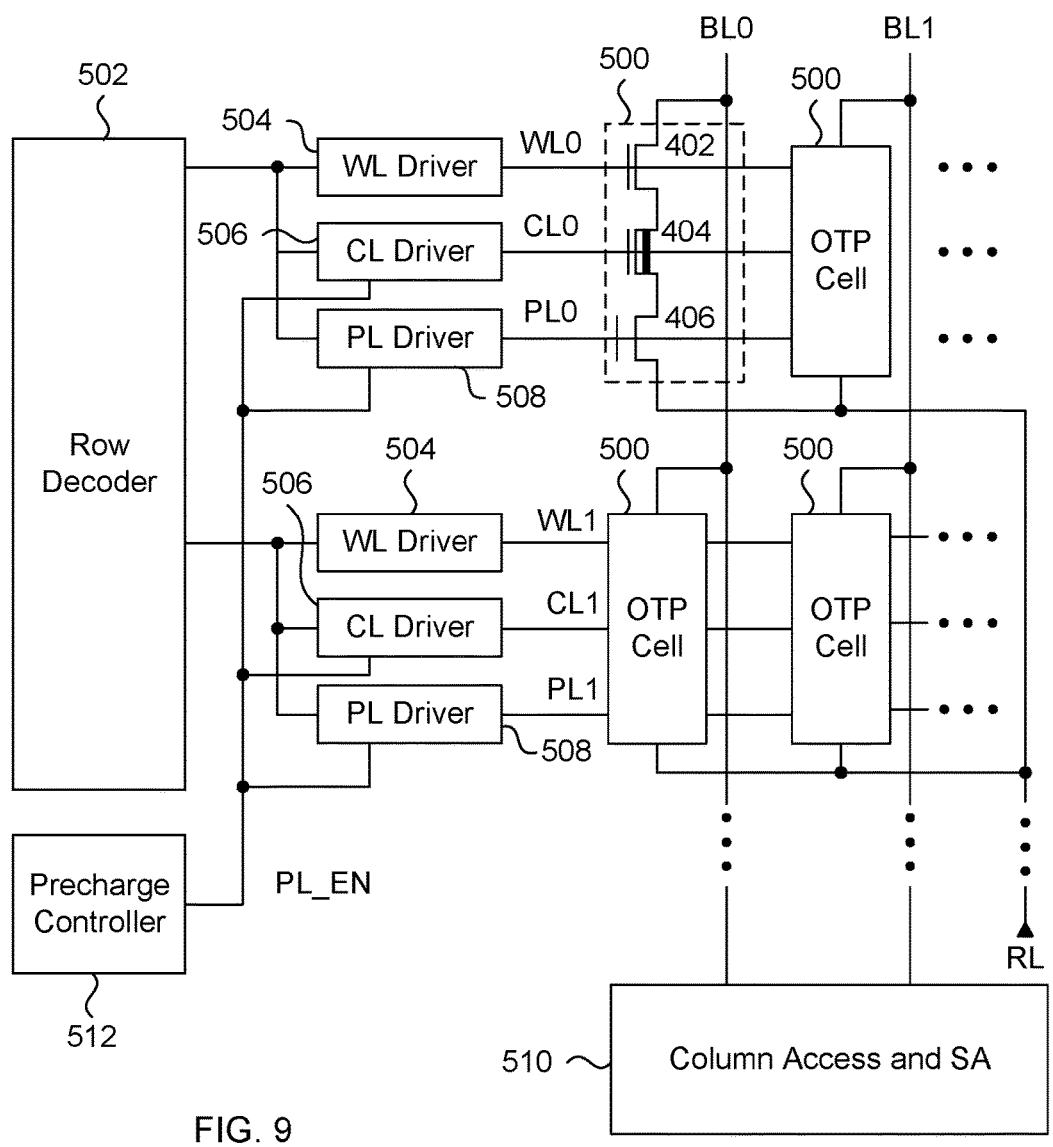
FIG. 8G is a table summarizing example read and program voltages used for the anti-fuse memory cell shown in FIGS. 8A and 8B.
FIG. 9 is a circuit schematic showing a memory device using the anti-fuse memory cell shown in FIG. 8A.

FIG. 9 is a circuit schematic showing memory cell 400 implemented in a memory device. The memory device of FIG. 9 includes a memory array including anti-fuse memory cells 500, a row decoder 502, row drivers 504, 506, 508, column circuits 510 and a precharge controller 512. The memory device includes other circuits, but are not shown in order to simplify the schematic. The anti-fuse memory cells 500 are the same as the one shown in FIG. 8A, and the details of one cell are shown in FIG. 9. The remaining anti-fuse memory cells 500 are shown as simplified boxes. Each of the anti-fuse memory cells 500 of a row are connected to the same row control lines (wordline WL, program line CL and precharge line PL), while each of the anti-fuse memory cells 500 of a column are connected to the same bitline BL. All the anti-fuse memory cells 500 are connected to the precharge voltage line RL. RL is controlled by a circuit (not shown) to drive it to either VSS during a read operation or HV1 during a programming operation. In the presently shown example, the row control lines for the first row of anti-fuse memory cells are labelled with the number 0, while the row control lines for the second row of anti-fuse memory cells 500 are labelled with the number 1. Similarly, a first bitline is labelled with the number 0 and a second bitline is labelled with the number 1. Two rows and two columns of memory cells are shown in FIG. 9, but such a memory array can include any number of rows and columns of anti-fuse memory cells 500.

The row decoder 502 and row drivers 504, 506 and 508 are collectively referred to as row circuits. The row decoder 502 decodes a received row address (not shown) in order to enable one set of row drivers 504, 506 and 508 via a row selection signal. The row decoder is fabricated with low voltage core transistor devices, and therefore receive the VDD supply voltage level. On the other hand, each of the row drivers 504, 506 and 508 receives at least one high-voltage level signal that is greater than VDD, and therefore includes high-voltage transistors and level shifter circuits. As an example, WL Driver 504, CL Driver 506, and PL Driver 508 receive at least the voltages shown in the table of FIG. 8G. The three row drivers 504, 506 and 508 are enabled at the same time in response to the decoded row address.

The column circuits 510 include column access devices, sense amplifiers, bitline precharge circuits, and write drivers, which are collectively shown in box 510. The column circuits 510 are responsible for biasing the bitlines to the program enable voltage or the program inhibit voltage based on the data to be written to each row of anti-fuse memory cells 500 and a programming operation. In a read operation, the column circuits are responsible for reading out the data stored in the anti-fuse memory cells 500 via the bitlines.

Operation of the memory device shown in FIG. 9 is similar to previous memory device shown in FIG. 7. To program a row of anti-fuse memory cells 500, the precharge controller 512 enables all the PL drivers 508, which can be done via a control signal such as control signal PL_EN. The bitlines BL0, BL1 are then precharged to the program inhibit voltage (e.g., VDD) and left to float, or kept at that level. Alternately the voltages can be reversed for the bitline precharge and write data biasing if the anti-fuse memory cell 500 was P-type. The row decoder 502 then selects one set of row control lines by enabling drivers 504, 506 and 508 to apply the respective voltages to the gates of anti-fuse memory cells 500. Accordingly, if there is any leakage of current from the bitlines there is no write disturb because the precharge transistors 406 of the anti-fuse memory cells 500 will provide a weak current to anti-fuse device 404 to keep its channel at a high enough voltage level to inhibit programming due to the application of the program line CL.

Next, a pull down driver in circuit 510 will discharge the bitline to VSS and is designed to drive more current than precharge transistor 406 can provide to the anti-fuse device. In other words, this pull down driver is configured to overcome the saturation drain current (IDSAT) of precharge transistor 406. Therefore, at least one edge of the channel of anti-fuse device 404 falls to VSS or a voltage sufficiently low enough to enable programming to occur. These previously described steps occur for an anti-fuse memory cell 500 to be programmed. Otherwise, the bitline remains at the program inhibit voltage level.

The present embodiment of FIG. 9 is shown using anti-fuse memory cells 500 where the anti-fuse device 400 includes the high voltage LDD in the channel. It is noted at this time in an alternate embodiment, the anti-fuse memory cells 500 do not have the high voltage LDD in the channel. The operations described above apply equally to this alternate embodiment of the anti-fuse memory cells 500, and a conductive link will form in the thin gate oxide to couple the gate to the channel of anti-fuse device 400.

During a read operation, the precharge controller 512 disables PL Drivers 508 via PL_EN, so the precharge devices 406 remain off, and at the same time enables all CL Drivers 506 so that a read voltage or VDD is applied to all CL lines in the selected row. The same PL_EN signal can be used and logic within CL Drivers 506 can be configured to respond to this logic state of PL_EN. The read voltage level is preferably VDD, but it can be optimized for read speed and power. For example, a boosted read voltage may be needed for fast memory access.

As previously mentioned, drivers 504, 506 and 508 each provide different high or low voltage levels, and therefore include voltage level shifters. These high voltage devices and level shifters consume significant chip area, and in a memory array where each row of cells requires three such drivers, the area overhead is high. The next following anti-fuse memory cell embodiment alleviates this problem for applications where the memory device chip area reduction is important.

FIG. 10A is a circuit diagram representing an anti-fuse memory cell 600 with integrated write disturb inhibit. This cell includes an access transistor 602, a cascode device 604, an anti-fuse device 606 and a precharge transistor 608 connected in series between a bitline BL and a precharge voltage line RL. This is an N-type memory device as the substrate channel is P-type and the diffusion regions and LDD regions are all N-type. A P-type device can be similarly constructed be reversing the doping types. The access transistor 602 has a gate connected to a wordline signal WL. The cascode device 604 has a gate connected to cascode line QL. The gates of anti-fuse device 606 and precharge transistor 608 are connected to PL and CL respectively.

The access transistor 602, cascode device 604, and anti-fuse device 606 are fabricated with a low voltage process, and accordingly, have thin gate oxides which correspond to those used in low voltage core logic circuitry formed on the same device. The precharge transistor 608 is fabricated with a high voltage process, and accordingly, has a thick gate oxide which corresponds to those used in high voltage transistors formed on the same device. This thick gate oxide is thicker than the gate oxides of access transistor 602, cascode device 604 and anti-fuse device 606. The difference between the anti-fuse memory cell of FIG. 8A and FIG. 10A is the presence of the cascode device 604.

The role of cascode device 604 is to reduce the drain voltage on the access transistor 602 during programming, so the access WLs can be switched on and off, while the high programming voltage is applied to the anti-fuse device 606 during programming. The anti-fuse device 606 diffusion adjacent the cascode device 604 is exposed to high voltages during program operations, and therefore devices 604 and 602 can experience gate induced drain leakage (GIDL). This GIDL is minimized or eliminated with the application of the above noted high voltages on QL which changes the shape of the depletion region under the gate.

FIG. 10B is a plan view of the anti-fuse memory cell 600 of FIG. 10A that shows the relative dimensions of the active area 610, and the gates 612, 614, 616 and 618 of respective devices 602, 604, 606 and 608. Labels for WL, QL, CL and PL indicate the signals the gates 612, 614, 616 and 618 are connected to. Contacts 620 and 622 are provided to allow for electrical connection to the bitline BL and the precharge voltage line RL. The active area 610 has a width dimension that is set to a minimum value allowed for the process, where the width dimension in the orientation of FIG. 10B is the vertical dimension of the page and the length dimension corresponds to the horizontal dimension of the page. The length of gate 616 is set to be a minimum allowed by the lithography or at most the minimum allowable length for a low voltage transistor of the process. The length of gate 612 of the access transistor 602 may be at least the minimum allowable length for the low voltage transistor of the process. The gate length of the cascode device 604 is optimized for GIDL. It is generally desirable to keep the overall size of the memory cell minimized, which is why minimum dimension features are used where possible.

As in the embodiment of FIG. 8B, the precharge transistor 608 may be optimized to provide small blocking current. The functionality, design parameters and all other previous comments about precharge transistor 406 and the active area sizing in FIG. 8B-8F apply to precharge transistor 608 of FIG. 10B. Because the precharge transistor 608 is further fabricated with a thick gate oxide, a low-level current can be provided by precharge transistor 608 to the anti-fuse device 606 with the proper combination of voltage applied by precharge line PL and precharge voltage line RL.

As a result of the addition of cascode device 604, several advantages are realized. First, no row decoding of signal lines QL, CL and PL is required. Second, WL can be driven with low voltage levels, as can the bitlines. Therefore, fewer high voltage transistors and voltage level shifters are required. This is illustrated in the memory device embodiment shown later in FIG. 11. FIG. 10C summarizes example voltages which can be applied to the gates of anti-fuse memory cell 600 during program and read operations. These levels are similar to those shown in FIG. 8G, except for the addition of QL.

Figure 11:
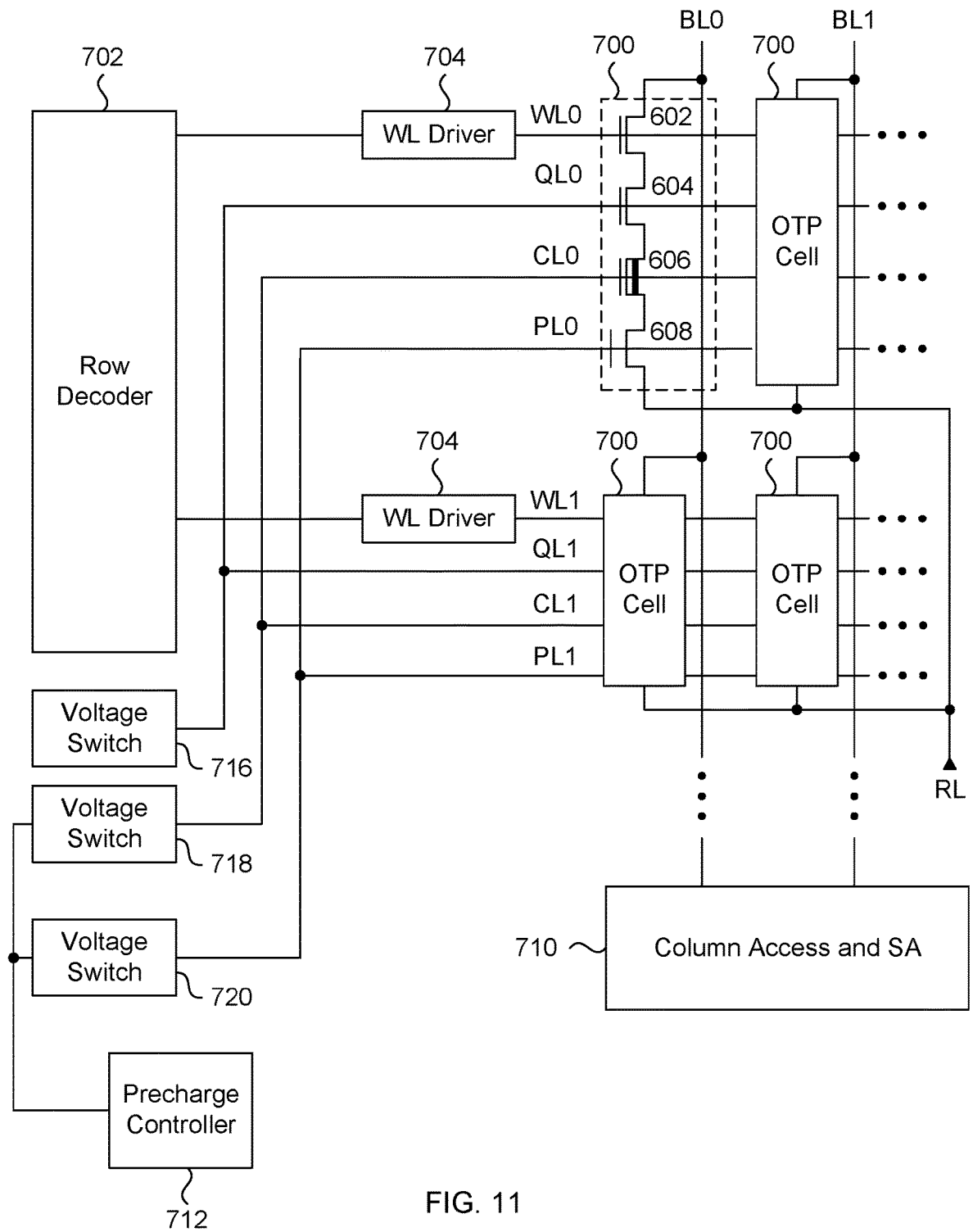
FIG. 11 is a circuit schematic showing a memory device using the anti-fuse memory cell shown in FIG. 10A.

The table of FIG. 10C shows example voltages which can be applied to the lines RL, PL, CL, QL, WL and BL of FIG. 11, and to the terminals of the anti-fuse memory cell 600 of FIGS. 10A and 10B. The columns named "PROGRAM INHIBIT (same WL)" and "PROGRAM INHIBIT (other WL)" have identical RL, PL, CL and QL voltages except for WL which is at 0V for the "PROGRAM INHIBIT (other WL)" column. This is intended to indicate that the other WL is one that is not selected for programming. This is the same situation for the two columns named "Alternative INHIBIT (same WL)" and "Alternative INHIBIT (other WL)". The voltages applied in the "PROGRAM" and both "PROGRAM INHIBIT" columns are the same as those shown in the corresponding columns of the table in FIG. 8G. In FIG. 10C, QL is set at VDD. Therefore, pre-charging of anti-fuse device 606 via precharge transistor 608 is the same for corresponding devices 404 and 406 respectively of the embodiment of FIG. 8A.

The voltages applied in the "Alternative PROGRAM" and both "Alternative INHIBIT" columns for RL, PL and CL are the same as those shown in the corresponding columns of the table in FIG. 8G. In FIG. 10C, QL is held at HV3 in these alternative program and inhibit columns. Furthermore, the selected wordline WL of FIG. 10C in the alternative program and inhibit columns is VDD instead of HV3 in FIG. 8G. The following discussion of a programming operation is made with reference to the voltages appearing in the alternative program and inhibit columns of FIG. 10C.

In a programming operation, the precharge line PL, the precharge voltage line RL, the program line CL and the cascode line QL are all driven to a high voltage level, referred to as HV1, HV2, VPGM and HV3 respectively. These voltages are selected to provide a small current to anti-fuse device 606 to raise the voltage level of its channel. Initially all WLs are at logic low level. Next, the selected wordline WL is driven to a logic high level, while the bitline BL is biased to either a program inhibit voltage level or a program enable voltage level based on the "write data" for the bitline BL. According to the present embodiment, VSS is the program enable voltage while VDD is the program inhibit voltage. The wordline WL high logic level couples the selected BL low voltage to the selected cell, programming the anti-fuse device in the same manner as was as described before in relation to the anti-fuse memory cell of FIG. 8B. The access device 602 and cascode device 604 dimensions and voltage levels are selected to overcome the precharge current and create sufficient voltage differential across the gate and source/drain diffusions of the anti-fuse device 606.

The source/drain and the channel of anti-fuse device 606 are held at the blocking voltage level by the program inhibit voltage level of the RL voltage via precharge transistor 608. Hence, the anti-fuse device 606 is prevented from being programmed under these voltage conditions. In a read operation, the bitline BL is precharged to VSS, RL and PL are held at VSS, CL is driven to VREAD, or VDD. The cascode device 604 is driven to VDD, and the WL is driven to logic high or low level depending if it is selected or not. If the anti-fuse device 606 includes a conductive link between its gate and the source/drain diffusion, then the voltage of the bitline will rise for subsequent detection by sense amplifier circuitry indicating one logic state. Otherwise, the bitline voltage remains at or near VSS which is sensed as the opposite logic state.

FIG. 11 is a circuit schematic showing memory cell 600 implemented in a memory device. The memory device of FIG. 11 includes a memory array having anti-fuse memory cells 700, a row decoder 702, a row driver 704, column circuits 710, a precharge controller 712, and voltage switch circuits 716, 718 and 720. The memory device includes other circuits, but are not shown in order to simplify the schematic. The anti-fuse memory cells 700 are the same as the one shown in FIG. 10A. The details of one cell are shown in FIG. 11. The remaining anti-fuse memory cells 700 are shown as simplified boxes. Each of the anti-fuse memory cells 700 of a row are connected to the same row control lines (wordline WL, program line CL, precharge line PL and cascode line QL), while each of the anti-fuse memory cells 700 of a column are connected to the same bitline BL. All the anti-fuse memory cells 700 are connected to the precharge voltage line RL. In the presently shown example, the row control lines for the first row of anti-fuse memory cells are labelled with the number 0, while the row control lines for the second row of anti-fuse memory cells 700 are labelled with the number 1. Similarly, a first bitline is labelled with the number 0 and a second bitline is labelled with the number 1. Two rows and two columns of memory cells are shown in FIG. 11, but a memory array may include any number of rows and columns of anti-fuse memory cells 700.

The row decoder 702, row driver 704 and voltage switch circuits 716, 718 and 720 can be collectively referred to as row circuits. The difference over the configuration of FIG. 9 is that separate drivers for CL, PL and QL are not required for each row of memory cells 700. Instead, lines CL, PL and QL are driven by distinct voltage switches 716, 718 and 720 globally throughout the memory array, where each voltage switch can provide at least the voltages shown in the table of FIG. 10C. In other words, lines CL, PL and QL do not require decoding by row decoder 702 and instead can simply be controlled to provide the appropriate voltage for the corresponding operation being executed in the memory array. Therefore, the number of high-voltage transistors and level shifter circuits is significantly reduced relative to the embodiment of FIG. 9. Although the memory cell 700 and resulting memory array of FIG. 11 is slightly larger in size than a memory array of the same density using the memory cell 600 of FIG. 9, the overall area of the memory device of FIG. 11 is still smaller due to the significant savings of area realized by the omission of high-voltage transistors and level shifter circuits that are not required for selectively driving CL, PL and QL for each row of memory cells.

The remaining elements 710 and 712 function the same as elements 510 and 512 of FIG. 9. The voltage switches 718 and 720 are controlled by precharge controller 712 to operate in the same manner as CL drivers 506 and PL drivers 508 of FIG. 9. More specifically, voltage switch 720 is disabled by precharge controller 712 so that no current is provided to anti-fuse device 606 by RL in a read operation. Concurrently with disabling voltage switch 720, voltage switches 716 and 718 are enabled. Similarly, the program and read operations of the memory device shown in FIG. 11 is similar to that of FIG. 9. Unlike the embodiment of FIG. 9, in the embodiment shown in FIG. 11, the WL Driver 704 is selectively enabled by row decoder 702 while the voltage switches 716, 718 and 720 are globally controlled to provide the necessary voltages for the corresponding operation.

The previously shown embodiments of FIGS. 8A, 8B, 8C and 10A, 10B and 10C show anti-fuse memory cells with integrated write disturb inhibit based on the 2T memory cell shown in FIG. 4. According to an alternate embodiment, the 1T anti-fuse memory cell 200 shown in FIG. 5A can be used to form an anti-fuse memory cell with integrated write disturb inhibit.

FIG. 12A is a circuit diagram representing an anti-fuse memory cell 800 with integrated write disturb inhibit, according to an alternate embodiment. This cell includes an access transistor 802, a cascode device 804, and a split-channel transistor 806 connected in series between a bitline BL and precharge voltage line RL. As previously described, the split-channel transistor as shown in FIG. 5A includes a thick gate oxide portion and a thin gate oxide portion. The thin gate oxide portion is the anti-fuse device, where the channel under the thin gate oxide portion is electrically coupled to the cascode device 804 via a common diffusion region. The thick gate portion functions as a transistor device, where the channel under the thick gate oxide portion is electrically coupled to RL via a diffusion region. This is an N-type memory device as the substrate channel is P-type and the diffusion regions and LDD regions are all N-type. As with the previously described embodiments, a P-type memory may be constructed by reversing doping type. The access transistor 802 has a gate connected to a wordline signal. The cascode device 804 has a gate connected to cascode line QL. The split-channel transistor 806 has a gate connected to program line CL.

The access transistor 802 and cascode device 804 are fabricated to have thin gate oxides which may correspond to those used in low voltage core logic circuitry formed on the same device. The split-channel transistor 806 has both thick and thin gate oxides, where the thin gate oxide portion may be the same as the thin gate oxides of transistors 802 and 804, or the same as those used in low voltage core logic circuitry. The thick gate oxide portion of split-channel transistor 806 is thicker than the gate oxides of access transistor 802, cascode device 804, and its adjacent thin gate oxide portion of the anti-fuse device. In some embodiments, this thick gate oxide portion corresponds to those used in high voltage transistors formed on the same device. As in the embodiment of FIG. 10A, the role of cascode device 804 is to protect the drain junction of the access transistor 802.

FIG. 12B is a plan view of anti-fuse memory cell 800 of FIG. 12A, that shows the relative dimensions of the active area 810, and the gates 812, 814 and 816 of respective devices 802, 804 and 806. Labels for WL, QL and CL indicate the signals of the gates 812, 814 and 816 are connected to. Contacts 820 and 822 are provided to allow for electrical connection to the bitline BL and the precharge voltage line RL. The active area 810 has a width dimension that is set to a minimum value allowed for the process, where the width dimension in the orientation of FIG. 12B is the vertical dimension of the page and the length dimension corresponds to the horizontal dimension of the page. The dashed line 824 shows the approximate area where the thick gate oxide portion of device 806 transitions to the thin gate oxide portion.

The thin gate oxide length of split-channel transistor 806 is reduced and can be less than the minimum feature size of the process. On the other hand, the length of the thick gate oxide portion of device 806 is configured as a long channel device, similar to precharge transistor 608 in the embodiment of FIG. 10B. The length of gate 814 is designed for reducing the leakage of the access device 812. The length of gate 812 of the access transistor 802 can be at least the minimum allowable length for the low voltage transistor of the process. Once again, the functionality, design parameters and all other previous comments about precharge transistor 406 and the active area sizing in FIG. 8B-8F apply to the transistor and anti-fuse devices of FIG. 12B. Although split channel transistor 806 has both thick and thin gate oxide portions, the active area for the thick portion can be sized as shown in the embodiment of 8D where active area size changes under the gate 414.

In prior applications of the split-channel transistor 806, the thick gate oxide portion functioned as an access transistor for electrically coupling a bitline to the channel underneath the thin gate oxide portion of split-channel transistor 806. In FIGS. 12A and 12B, this thick gate oxide portion of split-channel transistor 806 functions as a precharge transistor, similar to precharge transistors 406 and 608 in the previous embodiments of FIGS. 8A and 10A respectively. This precharge transistor portion of split-channel transistor 806 is fabricated with a thick gate oxide, and in combination with the long channel, a low-level current can be provided to the anti-fuse device (thin gate oxide portion of split-channel transistor 806) with the proper combination of voltage applied by line CL and precharge voltage line RL.

The addition of cascode device 804 provides advantages similar to the cell embodiment of FIG. 10A. First, no row decoding of signal lines QL and PL is required. Second, WL may be driven with low voltage levels, as may the bitlines. Therefore, fewer high voltage transistors and voltage level shifters may be used, relative to the memory device of FIG. 9 using the cell of FIG. 8A. FIG. 12C summarizes example voltages which can be applied to the gates of anti-fuse memory cell 800 during program and read operations. The table of FIG. 12C is discussed later with respect to FIG. 13. The programming operation is identical to the one described above in relation to FIG. 10A and FIG. 11, except that CL functions equivalently to PL and CL of FIG. 10A.

The read operation is essentially the same as the one described in relation to FIG. 10A and FIG. 11, except that a limitation is imposed on the read voltage level of CL because both the anti-fuse device (thin gate oxide portion of split-channel transistor 806) and the precharge device (thin gate oxide portion of split-channel transistor 806) share the same gate, and are thereby subject to the same CL voltage level. During a read operation, the CL read voltage is set to be lower than the Vt threshold voltage of the precharge device. Otherwise, the current through a programmed anti-fuse device may leak to RL which is held at VSS instead of being passed to the bitline BL. For example, in the 0.18 um process with 12V HV oxide option, the Vt of the precharge device can be as high as 2.5V. In this case, the OTP can be read with 1.8V on CL and 0V on RL. But if the Vt of the precharge device is 0.8V, the CL read voltage must be kept below 0.8V. Note that a certain CL to RL subthreshold leakage level through the programmed devices can be tolerated. For example, if the subthreshold leakage current is 1 nA and the programmed spot resistance is 20 KOhms, there is a 0.02 mV read signal drop caused by the leakage, but the leakage level can limit the size of the array that can be powered and read at a time. With 1 nA leakage per cell, a 1 Kbit sub-array block could leak as much as 1 uA. Accordingly, the sub-array size and the read voltage level may need to be optimized for the target application.

Figure 13:
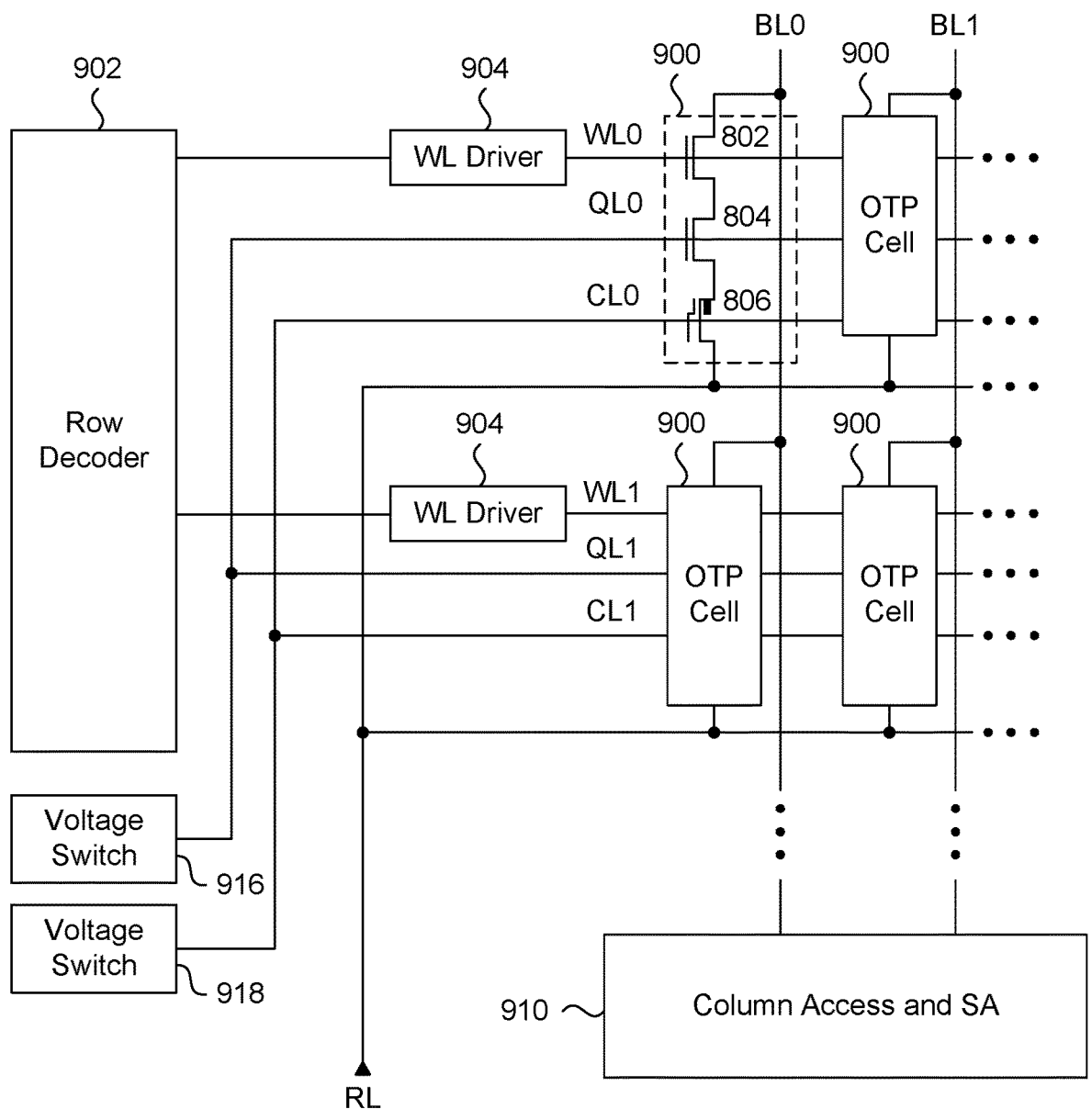
FIG. 13 is a circuit schematic showing a memory device using the anti-fuse memory cell shown in FIG. 12A.

FIG. 13 is a circuit schematic showing memory cell 800 implemented in a memory device. The memory device of FIG. 13 includes a memory array including anti-fuse memory cells 900, a row decoder 902, a row driver 904, column circuits 910 and voltage switch circuits 916 and 918. The memory device includes other circuits, but are not shown in order to simplify the schematic. The anti-fuse memory cells 900 are the same as the one shown in FIG. 12A, where the details of one cell are shown in FIG. 13. The remaining anti-fuse memory cells 900 are shown as simplified boxes. Each of the anti-fuse memory cells 900 of a row are connected to the same row control lines (wordline WL, program line CL and cascode line QL), while each of the anti-fuse memory cells 900 of a column are connected to the same bitline BL. All the anti-fuse memory cells 900 are connected to the precharge voltage line RL. In the presently shown example, the row control lines for the first row of anti-fuse memory cells are labelled with the number 0, while the row control lines for the second row of anti-fuse memory cells 900 are labelled with the number 1. Similarly, a first bitline is labelled with the number 0 and a second bitline is labelled with the number 1. Two rows and two columns of memory cells are shown in FIG. 13, but such a memory array may include any number of rows and columns of anti-fuse memory cells 900.

The row decoder 902, row driver 904, and voltage switch circuits 916 and 918 can be collectively referred to as row circuits. Signal lines CL and QL are driven by distinct voltage switches 916 and 918 globally throughout the memory array, where each voltage switch can provide at least the voltages shown in the table of FIG. 12C. In other words, lines CL and QL do not require decoding by row decoder 902 and instead can simply be controlled to provide the appropriate voltage for the corresponding operation being executed in the memory array. Therefore, the number of high-voltage transistors and level shifter circuits is significantly reduced relative to the embodiment of FIG. 9. Although the memory cell 900 and resulting memory array of FIG. 13 is about the same in size than a memory array of the same density using the memory cell 600 of FIG. 9, the overall area of the memory device of FIG. 13 is still smaller due to the significant savings of area realized by the omission of high-voltage transistors and level shifter circuits, which are not used to selectively drive CL and QL for each row of memory cells.

The table of FIG. 12C shows example voltages which can be applied to the lines RL, CL, QL, WL and BL of FIG. 13 and to the terminals of the anti-fuse memory cell 800 of FIGS. 12A and 12B. The columns named "PROGRAM INHIBIT (same WL)" and "PROGRAM INHIBIT (other WL)" have identical RL, CL and QL voltages except for WL which is at 0V for the "PROGRAM INHIBIT (other WL)" column. This is intended to indicate that the other WL is one that is not selected for programming. This is the same situation for the two columns named "Alternative INHIBIT (same WL)" and "Alternative INHIBIT (other WL)". The voltages applied in the "PROGRAM" and both "PROGRAM INHIBIT" columns are the same as those shown in the corresponding columns of the table in FIG. 10C. In FIG. 12C there is no PL line or voltage, as the PL function is integrated with CL. Therefore, pre-charging of combined anti-fuse device 806 with precharge device is the same for corresponding devices 606 and 608 respectively of the embodiment of FIG. 10A. The voltages applied in the "Alternative PROGRAM" and both "Alternative INHIBIT" columns for RL, CL, QL and WL are the same as those shown in the corresponding columns of the table in FIG. 10C.

In the previous embodiments, the precharge controller selectively disabled the generation of signal PL in a read operation. In FIG. 13, the split-channel transistor 806 has an anti-fuse device and precharge transistor integrated with each other and share a common gate controlled by signal CL accordingly, when CL is driven to VPGM to program an anti-fuse device, the integrated precharge transistor of the split-channel transistor 806 is concurrently turned on.

Because there is no separate control over the gate of the anti-fuse device and the gate of the precharge transistor in the split-channel transistor 806, the precharge voltage CL is optimized for read operations, as explained above.

In some embodiments, in a dual gate oxide process the thick gate oxide is a combination of intermediate and thin gate oxide (dielectric) process steps, while the thin gate oxide is a single oxide (dielectric) step, for example, a thermally grown oxide step. In a triple gate oxide process, transistors and devices with three different gate oxide thicknesses can be formed. A thick gate oxide is a combination of all three oxide steps. A medium thickness gate oxide is a combination of the second and third oxides (dielectrics). The thin gate oxide is the third oxide or dielectric. The OTP devices described in the present embodiments may use the thickest and the thinnest gate oxides in the bit cell, but other combinations are also possible, including all three oxides within a single device.

Figure 14:
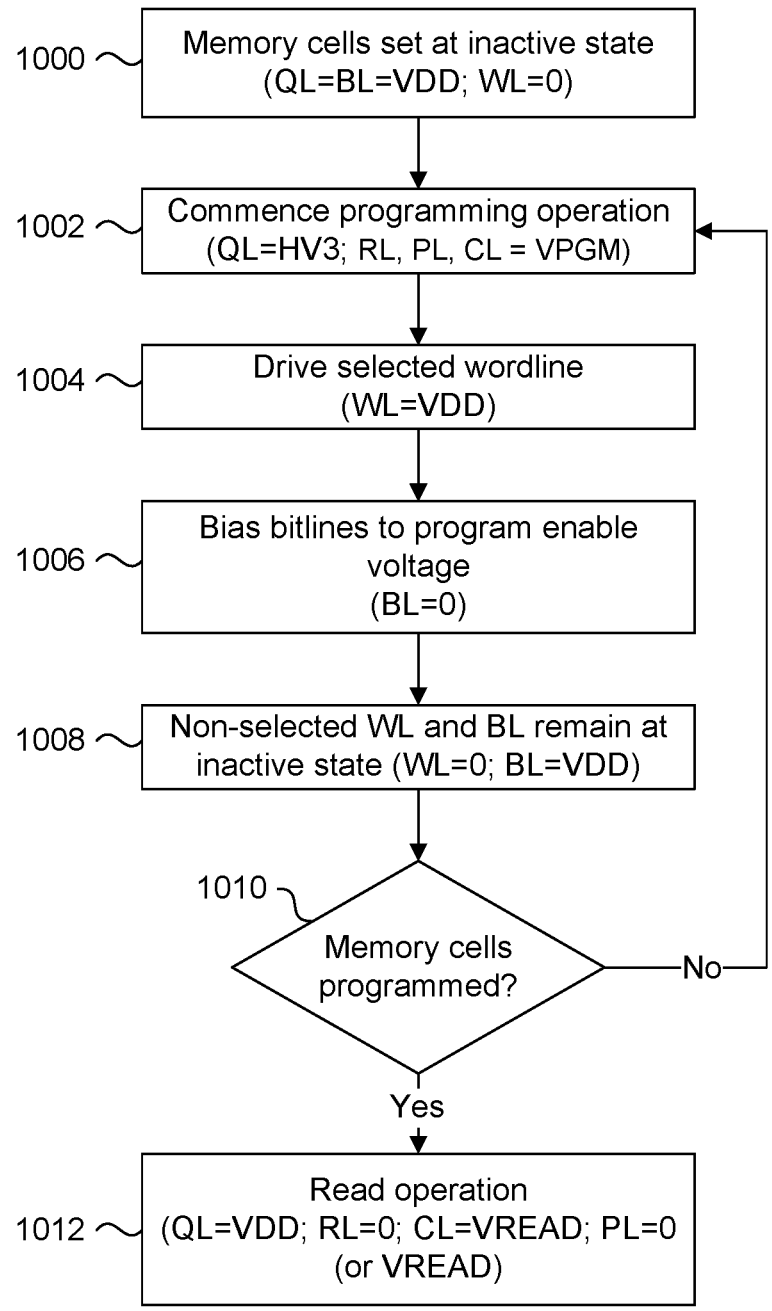
FIG. 14 is flow chart of a method for programming and reading an anti-fuse memory cell, according to a present embodiment.

FIG. 14 is a flow chart outlining a general method for programming and reading any of the previously disclosed anti-fuse memory cells with an integrated write disturb inhibit device. It is assumed that the anti-fuse memory cells with an integrated write disturb inhibit device have been implemented in a memory device such as the ones shown in the example embodiments of FIGS. 9, 11 and 13. Example voltages for the relevant signal lines are shown in parenthesis, which are also shown in the tables of FIGS. 8G, 10C and 12C.

The method starts at 1000, where the starting state of the memory cells is an inactive state, where QL, BL are at VDD and WL is at VSS or 0V, for example. Then at 1002, the programming operation commences by activating the precharge devices in the memory cells and applying the programming voltage to the anti-fuse devices. For example, QL is set to HV3, and RL, PL, CL are set to the programming voltage VPGM. A program inhibit voltage is applied by precharge devices within each memory cell, such as devices 406, 608 and the thick gate oxide portion of device 806 which are activated by signal PL to couple the anti-fuse devices to RL.

Following at 1004 and 1006, the selected wordline is driven to VDD and bitlines selected for the program enable voltage are biased to VSS. If the memory cell coupled to BL is to be programmed, then the appropriate column access circuitry is enabled to select BL, and circuitry is activated to drive BL to a program enable voltage, such as VSS in the present example. Accordingly, the second program inhibit voltage of BL is removed as BL is driven to the program enable voltage.

At 1008 all non-selected WL are held at the inactive state of 0V and the remaining bitlines are held at the inactive state of VDD. With BL being driven to the program enable voltage, application of the programming voltage electrically couples the precharge device to BL. Therefore, the program inhibit voltage is removed or changed to the program enable voltage via BL, and now the anti-fuse device can be programmed to form the conductive link in the thin gate oxide between the gate and the channel. For the bitlines held at VDD, the channel of the anti-fuse device rises and the electrical field between it and the gate is reduced to the point where programming of the anti-fuse device is inhibited. If BL leaks current, which can occur through many different nodes which are connected to BL, the precharge device will provide enough current to maintain the blocking voltage level of the channel. Therefore, the precharge device compensates for any current leakage from BL during programming operations.

A program verification step is executed at 1010 to check if the selected memory cells are successfully programmed. If not, the method returns to step 1002 and the programming operation is repeated. Otherwise, it is deemed that all the memory cells have been successfully programmed, and read operations can be executed at 1012 by applying the appropriate read voltages as shown in the previous tables.

In the embodiments described thus far, the bit cell elements were physically placed near each other, arranged as series connections of MOS devices sharing the active area. Such layout approach allows to reduce bit cell area, but it may compromise some if not all bit cell components. Although some layout optimization shown in FIGS. 8B to F is possible in older process nodes, it is difficult (if possible at all) to optimize the anti-fuse device dimensions, LDD, or Vt masks without compromising the precharge or access devices in the advanced process nodes. In addition, in the most advanced FinFet process nodes, like 7 nm and below, it becomes increasingly difficult to place the thin and thick oxide devices next to each other. The following description explains how these and other deficiencies are overcome using a bit cell according to present invention.

Figures 15A, 15B, 15C:
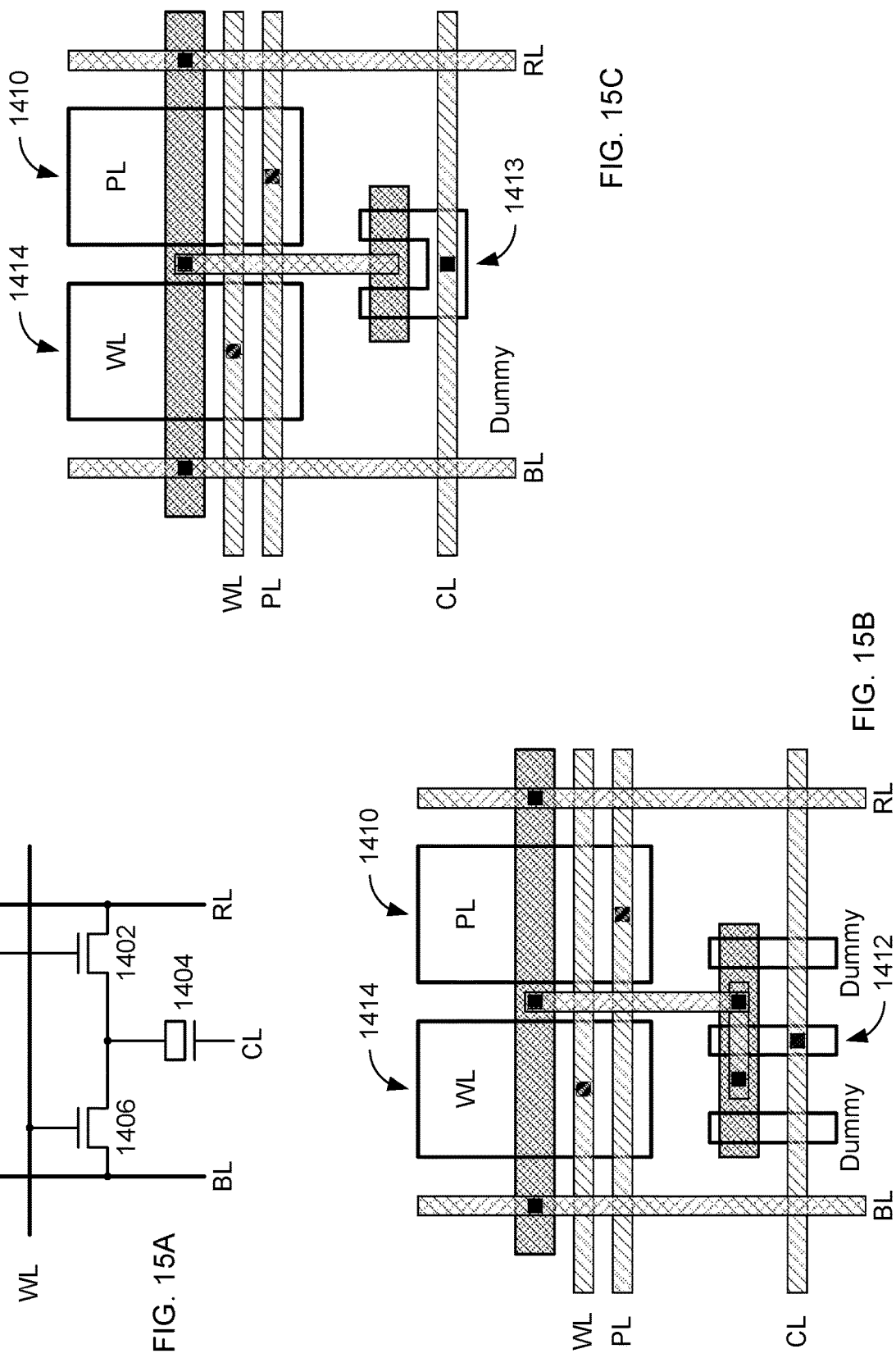
FIG. 15A is a circuit schematic of an anti-fuse memory cell with integrated write disturb inhibit device, according to another embodiment.
FIG. 15B is a plan view of the anti-fuse memory cell shown in FIG. 15A.
FIG. 15C is a plan view of an alternative version of the anti-fuse memory cell shown in FIG. 15A.

FIG. 15A shows a circuit representation of a FinFet embodiment of the bit cell according to the present disclosure. Compared to the previously described embodiment in FIG. 8A, the access device 406 is now implemented as high voltage (IO oxide) device 1406, the anti-fuse device 404 is now implemented as core oxide capacitor 1404 (e.g., a capacitor, including a transistor connected as a capacitor, having a core oxide between a gate and a body), and the precharge device 402 is now implemented as high voltage (IO oxide) device 1402, directly connected to the access device 1406 and to the anti-fuse device 1404. FIG. 15B is a planar view of the implementation shown in FIG. 15A. FIG. 15B shows that the access device 1414 is connected in series with precharge device 1410, and the anti-fuse device 1412 is placed separately and connected through a metal connection. The anti-fuse device 1412 may have its Source and Drain shorted together. Alternatively, as shown in FIG. 15C, two half transistor devices 1413 having one common diffusion and one gate each can be used as the anti-fuse device. Those skilled in the art will understand that an anti-fuse device of any shape and construction can be used in place of devices 1412 or 1413.

Figure 16A:
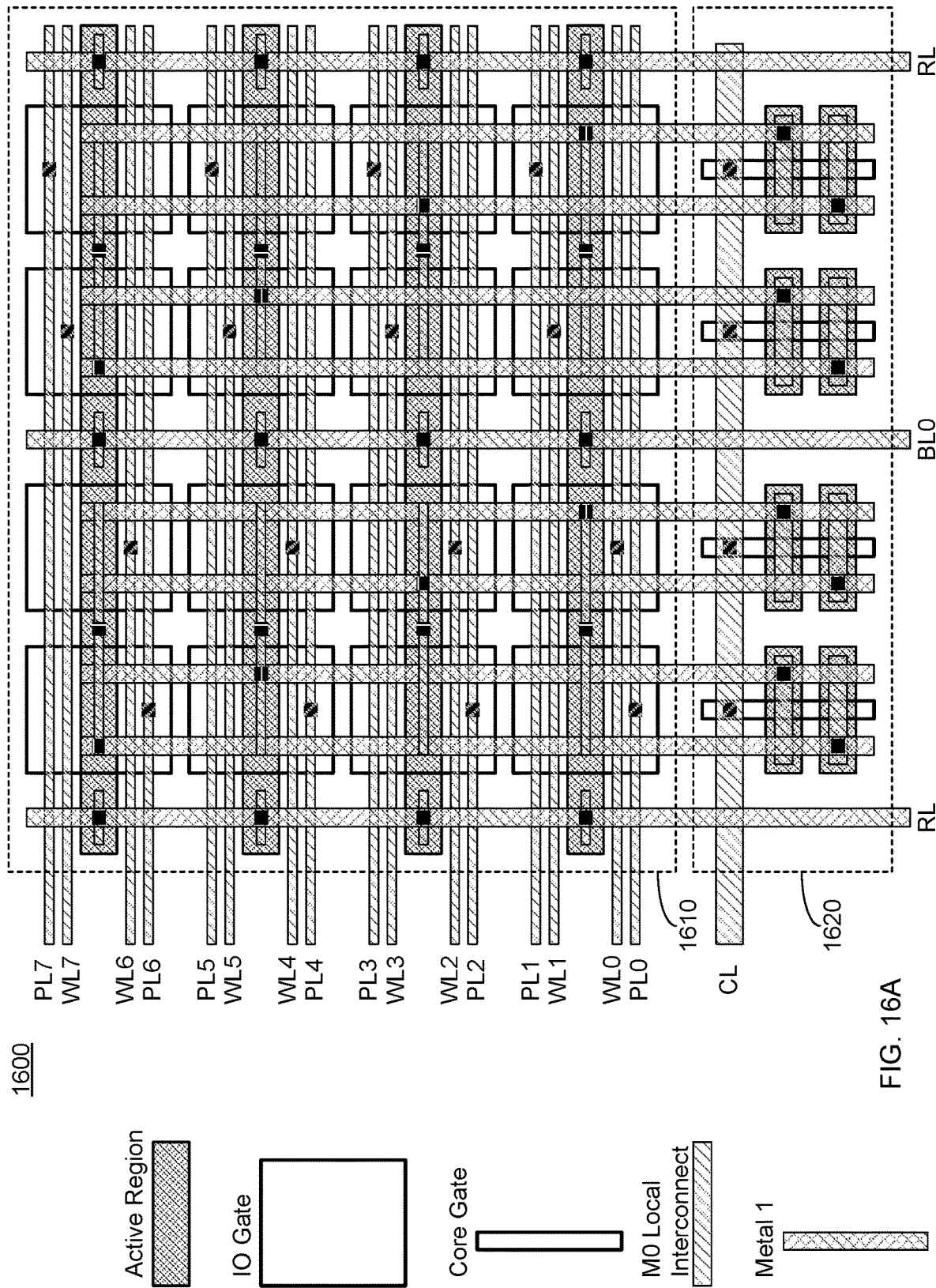
FIG. 16A is an example layout of a memory array using memory cell shown in FIG. 15A.
Figure 16B:
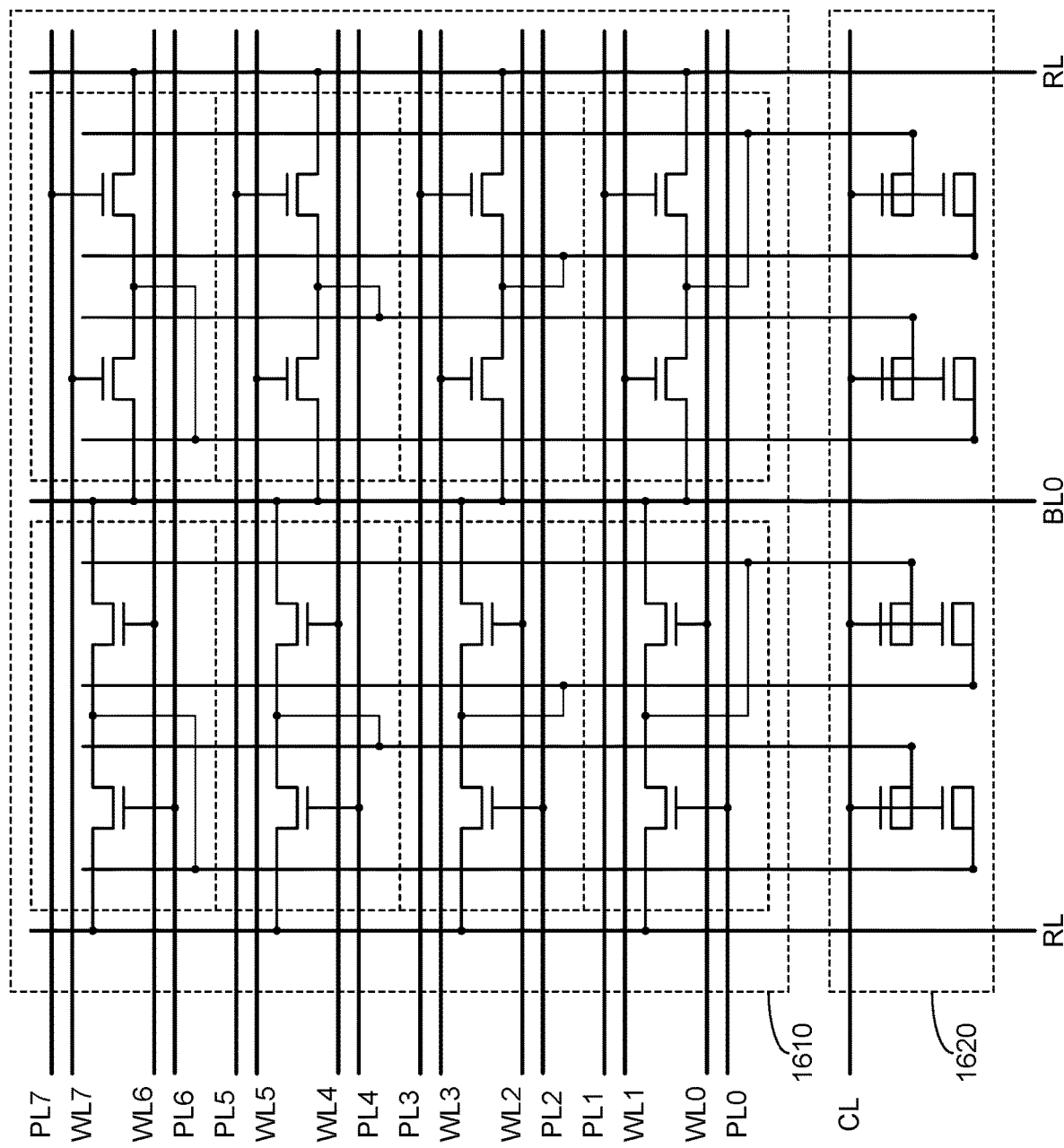
FIG. 16B is a schematic view of the memory array shown in FIG. 16A.
Figure 16C:
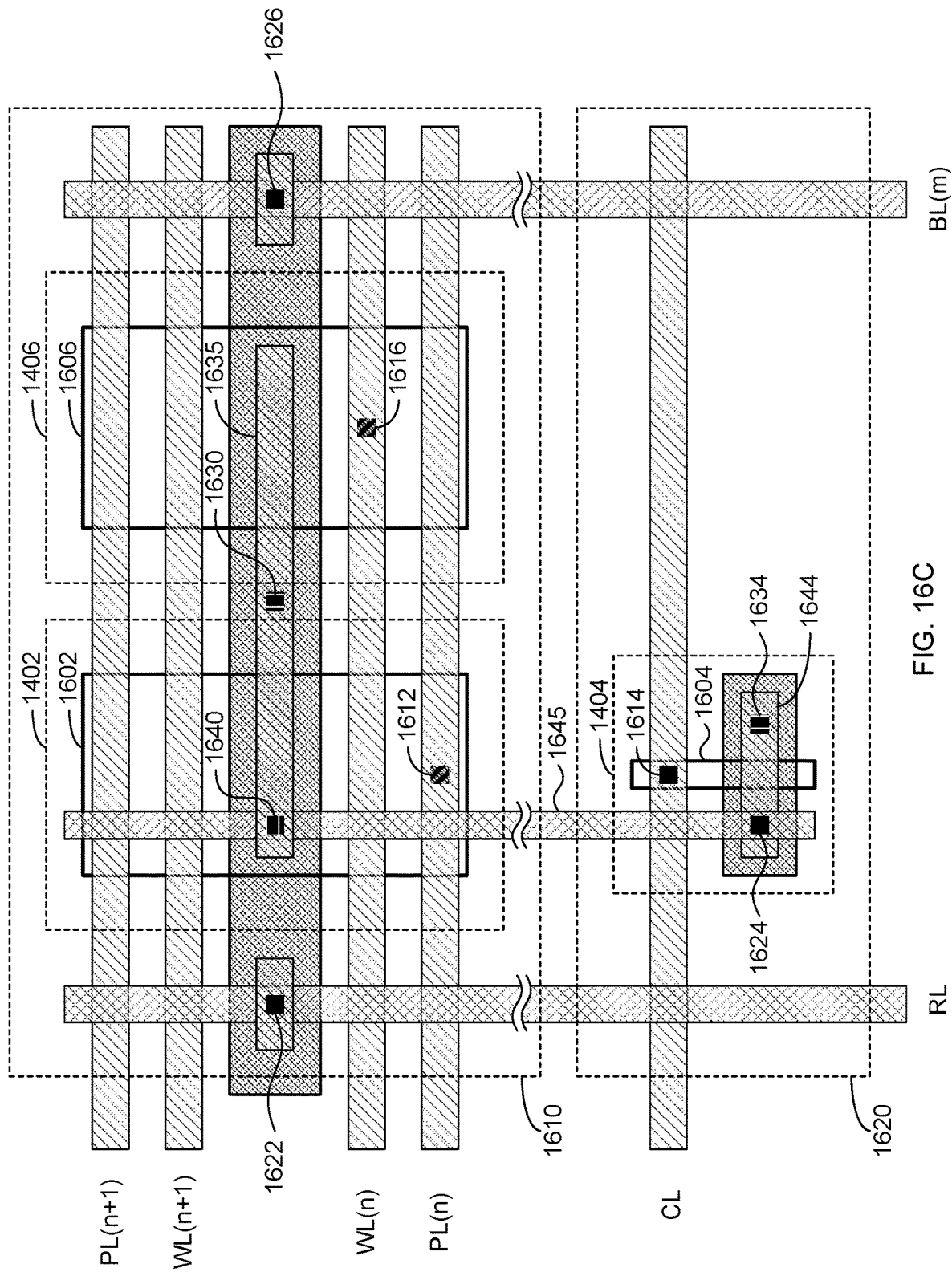
FIG. 16C is a simplified memory array showing a single bit cell.

FIG. 16A shows an example memory array using the bit cells from FIG. 15B. FIG. 16B shows a schematic view of the memory array shown in FIG. 16A. FIG. 16C shows a simplified memory array showing a single bit cell. The memory array 1600 has high-voltage device area 1610 and a core device area 1620.

The high-voltage device area 1610 includes an array of high-voltage fins having a thick oxide. As used herein, high-voltage fins are semiconductor fins formed in regions of an integrated circuit having an IO oxide (i.e., a thick oxide). The high-voltage (IO oxide) devices 1402 and 1406 are located in the high voltage device area 1610. For instance, the high-voltage devices 1402 and 1406 are high-voltage FinFETs formed using the array of high-voltage fins located in the high-voltage device area 1610. In particular, the high-voltage device area 1610 includes an array of high-voltage devices (high-voltage FinFETs) formed using the array of high-voltage fins. For example, the high-voltage device area 1610 includes an array of access devices 1406. In some embodiments, the array of access devices 1406 is an array of access FinFETs. In addition, the high-voltage device area 1610 may include an array of precharge devices 1402. In some embodiments, the array of precharge devices 1402 is an array of precharge FinFETs.

The core device area 1620 includes an array of core oxide fins having a thin oxide. As used herein, core oxide fins are semiconductor fins formed in regions of an integrated circuit having a core oxide (i.e., a thin oxide). For example, the thin oxide may be in the range between 10-20 Å. In some embodiments, the thin oxide may have a different thickness than the specified range. However, regardless of the thickness of the thin oxide, the thin oxide of the core oxide fins is thinner than the thick oxide of the high-voltage fins. The anti-fuse device 1404 is located in the core device area 1620. For instance, the anti-fuse device 1404 is formed using one or more fins of the array of core oxide fins located in the core device area 1620. In particular, the core device area 1620 includes an array of anti-fuse devices formed using the array of core oxide fins. In one embodiment, the array of anti-fuse devices is an array of anti-fuse FETs.

Since the thick and thin oxide devices are physically placed in different silicon areas, the access and precharge devices can be optimized for high voltage operation, while the core devices can be independently optimized for anti-fuse operation. For example, the anti-fuse devices can use minimum gate length and width (or minimum number of fins), while the access and precharge devices can use larger width and length for the program and precharge operations. Also, the LDD, Vt, and Well implants can be easily optimized for each device type.

Each cell of the memory array has an access device 1406 and a precharge device 1402. The gate 1602 of the precharge device 1402 is connected to the n-th precharge line PL(n) through poly-to-M0 contact 1612. Moreover, a first terminal (e.g., a source terminal or a drain terminal) of the precharge device 1402 is connected to RL through contact 1622. The second terminal (e.g., the drain terminal or the source terminal) of the precharge device 1402 is connected to the anti-fuse device 1404 through contact 1630. In some embodiments, the second terminal of the precharge device 1402 is connected to the anti-fuse device 1404 through a local interconnect 1635 and metal interconnect 1645. In the example implementation of FIG. 16C, local interconnect 1635 and metal interconnect 1645 are connected to each other through M0-to-M1 via 1640.

The gate 1606 of the access device 1406 is connected to the n-th wordline WL(n) through poly-to-M0 contact 1616. Moreover, a first terminal (e.g., a source terminal or a drain terminal) of the access device 1406 is connected to the second terminal of the precharge device 1402. The first terminal of the access device 1406 is further connected to the anti-fuse device 1404 through contact 1630, local interconnect 1635, M0-to-M1 via 1640, and metal interconnect 1645. In addition, the second terminal (e.g., a drain terminal or a source terminal) of the access device 1406 is connected to the m-th bitline BL(m) through contact 1626.

The gate 1604 of the anti-fuse device 1404 is connected to the control line CL line through poly-to-M0 contact 1614. Moreover, the first and second terminals (i.e., source and drain terminals) of the anti-fuse device 1404 are connected to metal interconnect 1645. In some embodiments, the first and second terminals of the anti-fuse device 1404 are connected to each other through local interconnect 1644. In the example of FIG. 16C, the second terminal of the anti-fuse device 1404 is connected to local interconnect 1644 through contact 1634, and the first terminal of the anti-fuse device 1404 is connected to the local interconnect 1644 through contact 1624. Additionally, the local interconnect 1644 is connected to the metal interconnect 1645 through contact 1624.

In the embodiment shown in FIGS. 16A, 16B, and 16C, the high voltage devices in the high voltage device area 1610 are connected to the core oxide devices in the core oxide device area 1620 through metal interconnects (such as metal interconnect 1645 of FIG. 16C) running from the core oxide device area 1620 to the high voltage device area 1610. In some embodiments, the metal interconnects going from the core oxide device area 1620 to the high voltage device area 1610 run perpendicular to the local interconnects (e.g., local interconnect 1635).

The table in FIG. 16D shows example read and programming voltage levels for the array shown in FIG. 16A. In this example, the anti-fuse gate voltage CL is not decoded (global for the array), while the precharge lines PL are decoded in the opposite phase to the WL. That is, when the WL is low, the PL is high protecting the anti-fuse devices against program disturb, and when the WL is high to enable programming of the bit cell, the corresponding PL is turned low. In this case, the BL voltage level selects which cell or cells will be programmed. A low level at a BL enables a cell to be programmed, while a high level at a BL protects the cells against disturb.

During read operation, the anti-fuse gate voltage CL can be kept at a constant voltage VDD as shown in FIG. 16D, or at another read voltage level optimized for read speed or power consumption. By default, all precharge lines PL are "ON" (or high) between read cycles, biasing the internal bit cell nodes to a voltage determined by RL and PL voltage levels, thus minimizing the stress across the anti-fuse devices. For example, if the CL, PL and RL are all at VDD voltage level, the voltage differential across the anti-fuse is equal to Vt, the threshold voltage of the precharge device. This arrangement allows use of a global CL plate with higher (boosted) read voltage level without overstressing the bit cells. Since the un-decoded (or global) CL node supplies multiple rows of cells (or multiple cell arrays), the overall memory area is reduced by eliminating multiple high voltage drivers and levels shifters otherwise needed to supply multiple CL lines. In addition, a higher capacitance of the global CL node allows for faster read operation, and for better program efficiency. In this embodiment, the PL lines are decoded with opposite phase to the WLs during read and program operation. That is, PL is high when WL is low, and vice versa, PL is low when WL is high.

Figure 17A:
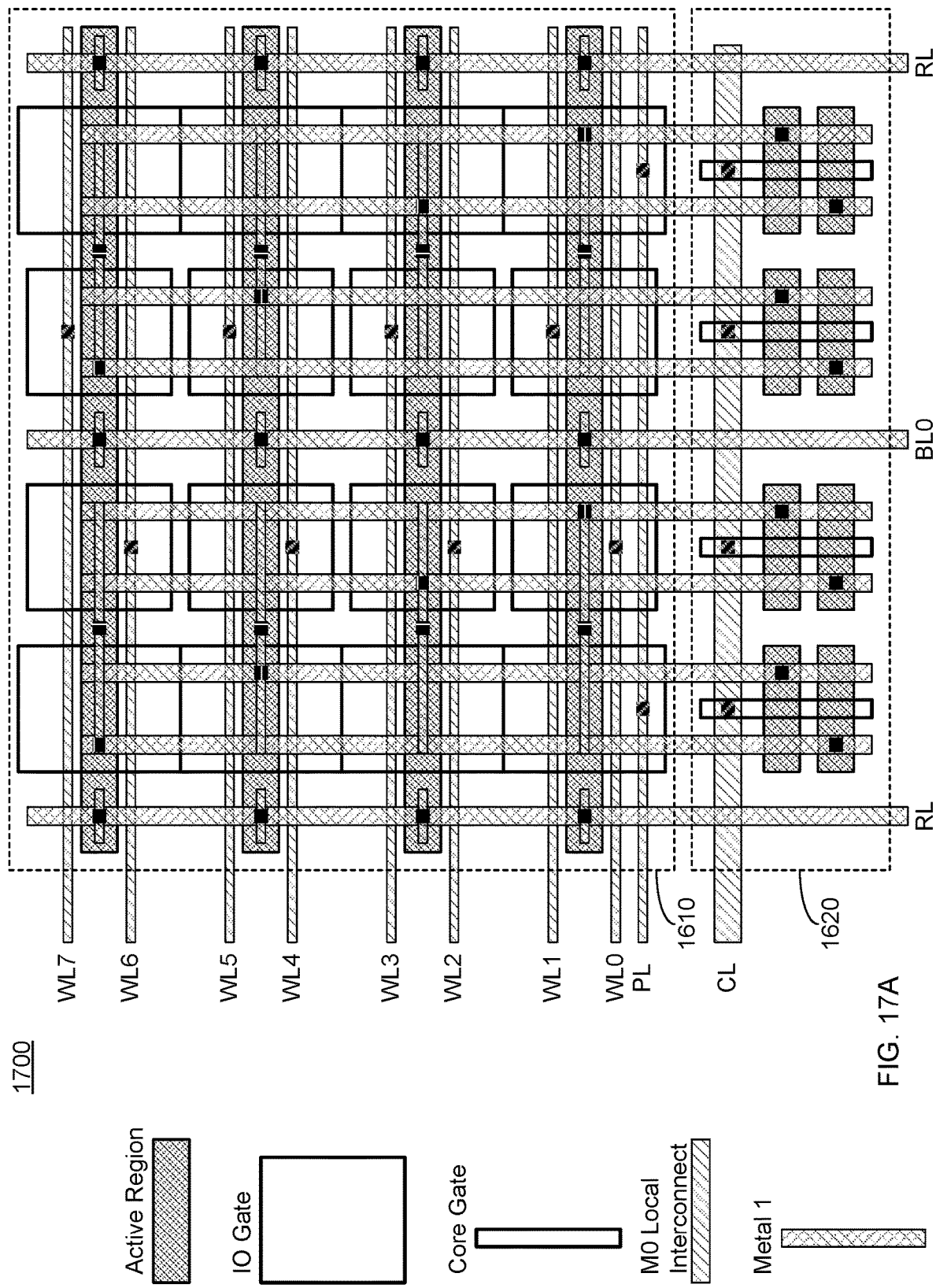
FIG. 17A is another example layout of a memory array using memory cell shown in FIG. 15A.
Figure 17B:
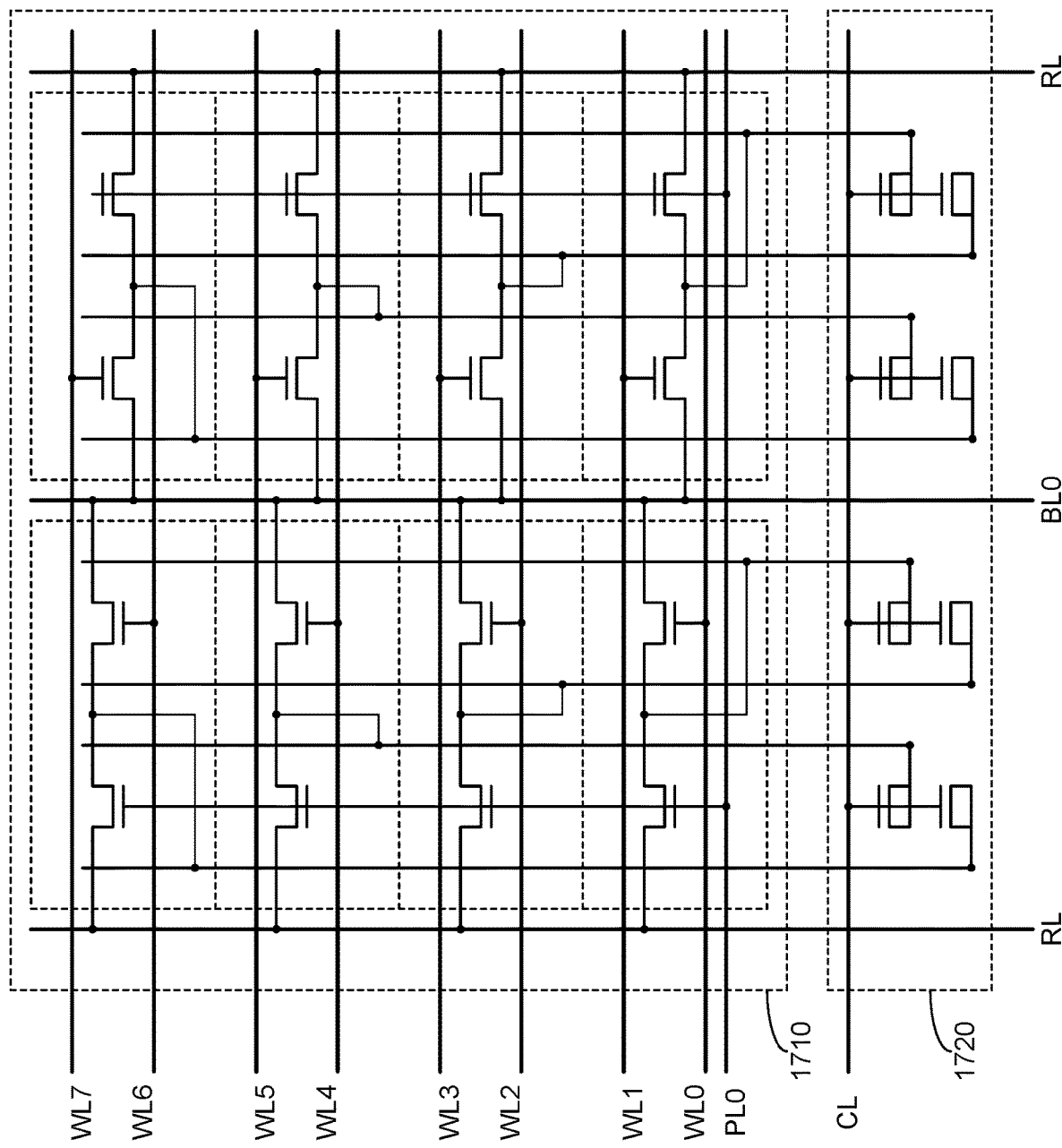
FIG. 17B shows a schematic view of the alternative layout of the array shown in FIG. 17A.
Figure 17C:
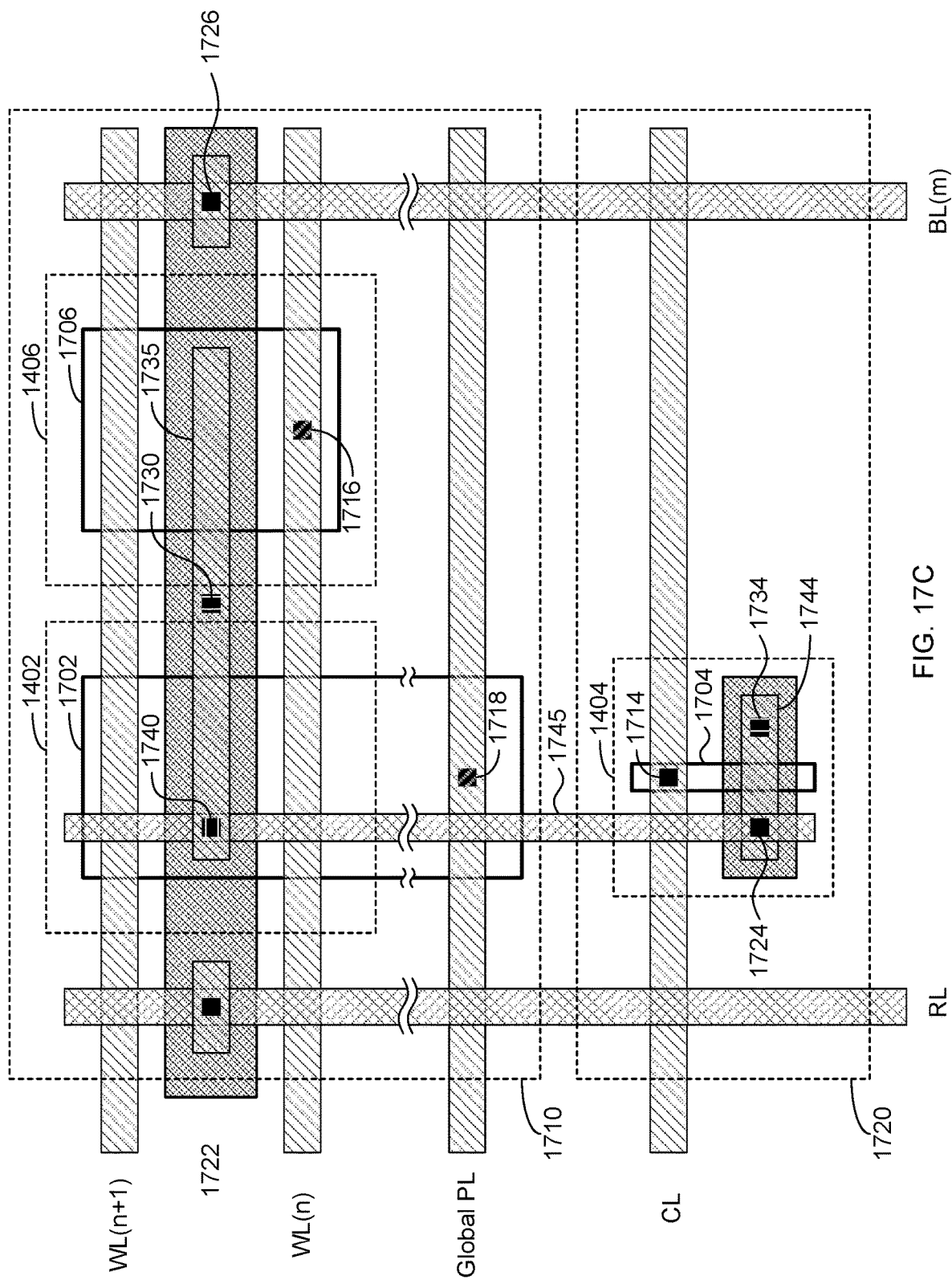
FIG. 17C shows a simplified memory array showing a single bit cell.

FIG. 17A shows an alternative layout of the array employing the bit cells shown in FIG. 15B. FIG. 17B shows a schematic view of the alternative layout of the array shown in FIG. 17A. FIG. 17C shows a simplified memory array showing a single bit cell. In this example, the PL lines are not decoded, and are controlled globally for an entire array, or for multiple rows of cells.

Each cell of the memory array has an access device 1406 and a precharge device 1402. In the alternate layout shown in FIG. 17A, the gates 1702 of multiple precharge devices 1402 are connected to each other, and to a single global precharge line PL. For instance, as shown in FIG. 17C, the gate 1602 of the precharge device 1402 is connected to the global PL through poly-to-M0 contact 1618. A first terminal (e.g., a source terminal or a drain terminal) of the precharge device 1402 is connected to RL through contact 1722. The second terminal (e.g., the drain terminal or the source terminal) of the precharge device 1402 is connected to the anti-fuse device 1404 through contact 1730. In some embodiments, the second terminal of the precharge device 1402 is connected to the anti-fuse device 1404 through a local interconnect 1735 and metal interconnect 1745. In the example implementation of FIG. 16C, local interconnect 1735 and metal interconnect 1745 are connected to each other through M0-to-M1 via 1740.

The gate 1706 of the access device 1406 is connected to the n-th wordline WL(n) through poly-to-M0 contact 1716. Moreover, a first terminal (e.g., a source terminal or a drain terminal) of the access device 1406 is connected to the second terminal of the precharge device 1402. The first terminal of the access device 1406 is further connected to the anti-fuse device 1404 through contact 1730, local interconnect 1735, M0-to-M1 via 1740, and metal interconnect 1745. In addition, the second terminal (e.g., a drain terminal or a source terminal) of the access device 1406 is connected to the m-th bitline BL(m) through contact 1726.

The gate 1604 of the anti-fuse device 1404 is connected to the control line CL line through poly-to-M0 contact 1614. Moreover, the first and second terminals (i.e., source and drain terminals) of the anti-fuse device 1404 are connected to metal interconnect 1645. In some embodiments, the first and second terminals of the anti-fuse device 1404 are connected to each other through local interconnect 1644. In the example of FIG. 16C, the second terminal of the anti-fuse device 1404 is connected to local interconnect 1644 through contact 1634, and the first terminal of the anti-fuse device 1404 is connected to the local interconnect 1644 through contact 1624. Additionally, the local interconnect 1644 is connected to the metal interconnect 1645 through contact 1624.

In the embodiment shown in FIGS. 16A, 16B, and 16C, the high voltage devices in the high voltage device area 1610 are connected to the core oxide devices in the core oxide device area 1620 through metal interconnects (such as metal interconnect 1645 of FIG. 16C) running from the core oxide device area 1620 to the high voltage device area 1610. In some embodiments, the metal interconnects going from the core oxide device area 1620 to the high voltage device area 1610 run perpendicular to the local interconnects (e.g., local interconnect 1635).

The table in FIG. 17D shows the voltage levels for program and read operations for the array shown in FIG. 17A. At the beginning of program cycle, the entire array is precharged by driving the global PL and CL lines high. Next, the PL voltage is removed (driven low) and the selected WL is activated, which programs the cell that is coupled to the grounded BL. The unselected BLs are kept high at inhibit voltage level. Such dynamic bit cell precharge strategy can be effectively used if the internal bit cell diffusion node does not have excessive junction or GIDL leakage to ground, so the precharged blocking voltage level is maintained throughout a program pulse.

In this embodiment, read operation starts from a precharge cycle with global PL signal "ON" for biasing all bit cells to a precharge voltage level, as described with respect to FIG. 16D. However, unlike in FIG. 16D, in case of FIG. 17D, a global PL signal is turned "OFF" or low before the WL is turned on in the read cycle. Note that the global read precharge operation can be omitted if the CL read voltage is VDD or lower, if the anti-fuse cells can withstand constant VDD bias on the CL node without PL precharge reducing the stress across the anti-fuse gate.

The anti-fuse memory cell embodiments have been described as having specific channel lengths or widths, and thick and/or thin gate oxide combinations. Any combination of these structural parameters may be adjusted to arrive at the desired result of low biasing current being provided to the anti-fuse device. References to minimum dimensions of any semiconductor structure are made contextually to any particular semiconductor manufacturing process where specific design rules are applied. Similarly, any anti-fuse device or devices can be used in place of the once in disclosed embodiments. For example, FIGS. 18A-B, 19A-B, and 20A-C show alternative embodiments of the bit cell from FIG. 15A and FIG. 15B.

Figure 18B:
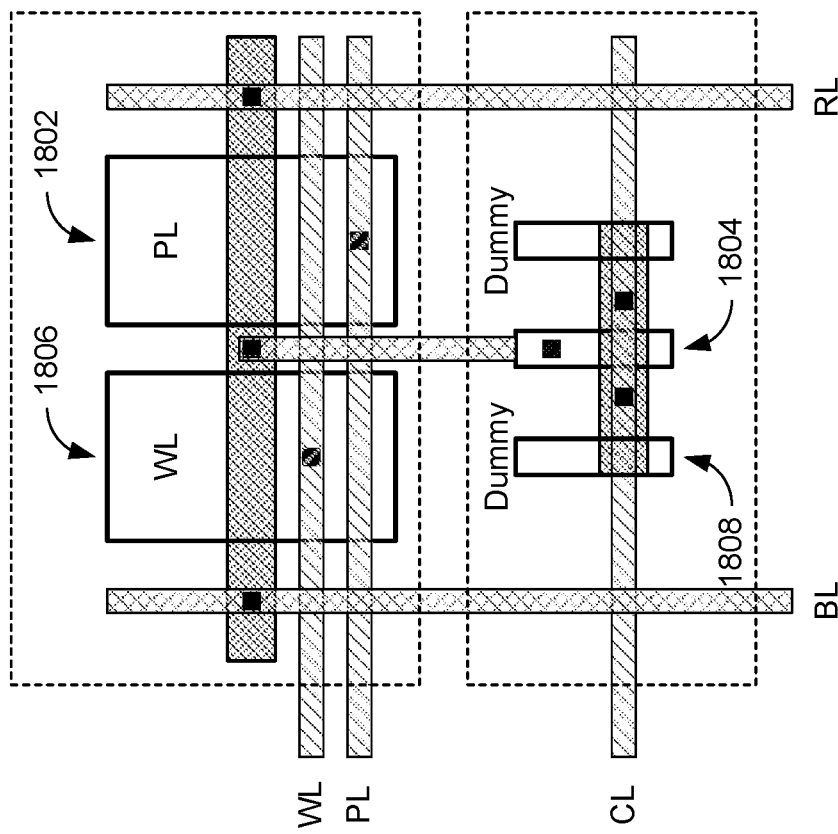
FIG. 18B is a plan view of the anti-fuse memory cell shown in FIG. 18A.
Figure 18A:
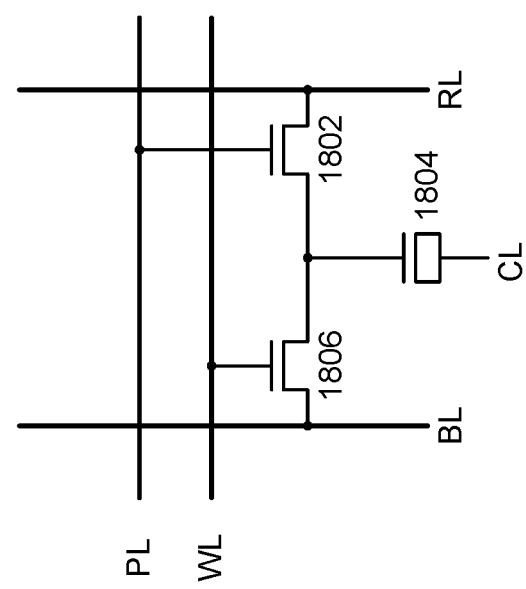
FIG. 18A is a circuit schematic of an alternative FinFet anti-fuse memory cell with integrated write disturb inhibit device.

In the embodiment of FIGS. 18A-B, the gate of the anti-fuse device 1804 is connected to the access device 1806 and the precharge device 1802. Moreover, the source and drain of the anti-fuse device 1804 is connected to the control line CL.

Figure 19B:
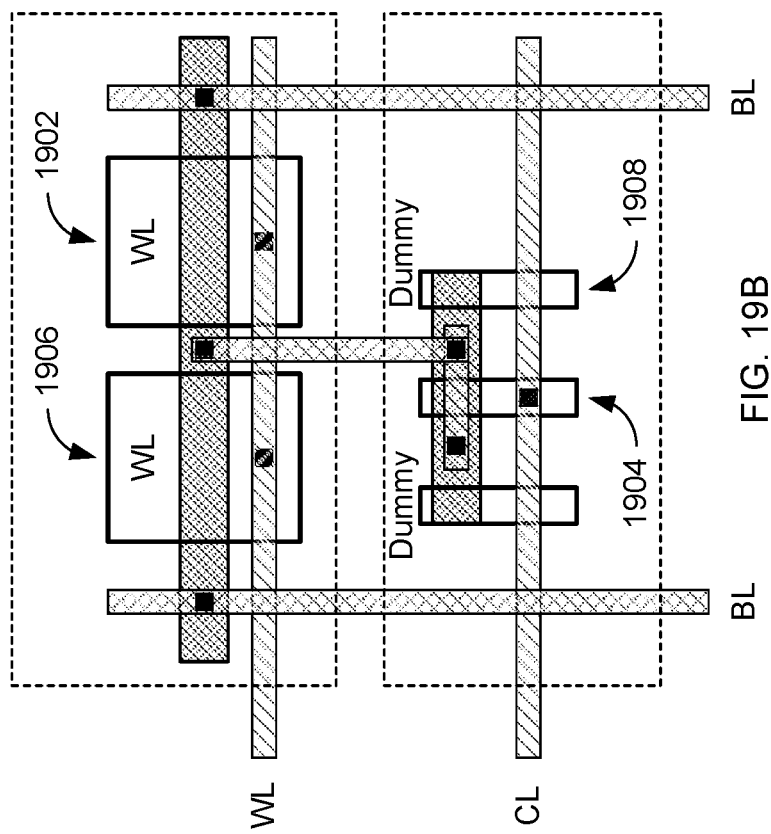
FIG. 19B is a plan view of the anti-fuse memory cell shown in FIG. 19A.
Figure 19A:
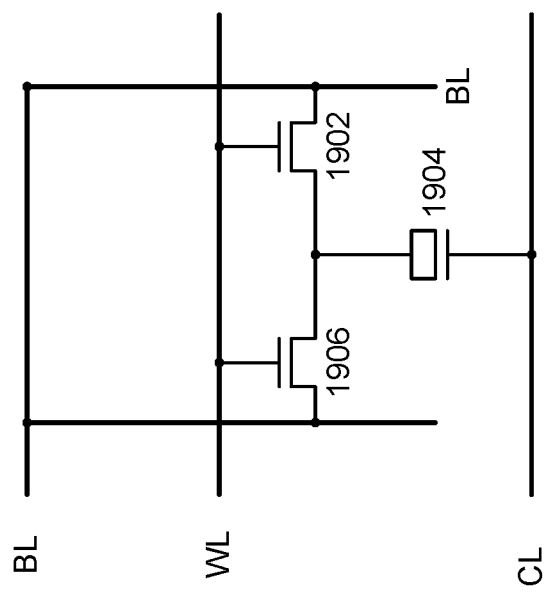
FIG. 19A is a circuit schematic of a second alternative FinFet anti-fuse memory cell with integrated write disturb inhibit device.

In the embodiment of FIGS. 19A-B, both the access device 1906 and the precharge device 1902 are connected to the wordline WL. Moreover, both the access device 1906 and the precharge device 1902 are connected to the bitline BL. That is, both devices 1906 and 1902 are connected in parallel. In the embodiment of FIGS. 20A-B, a dummy device 2002 is included instead of a precharge device. FIG. 20C shows a memory word implemented with the bit cell of FIGS. 20A-B. Moreover, in the embodiments of FIGS. 18A-B, 19A-B, and 20A-B, the anti-fuse device is connected to dummy devices 1808, 1908, 2008. In some embodiments, the active region of the dummy devices extends to an edge of their respective dummy gates. In other embodiments, the active region ends under the dummy gate but before reaching the edge of the dummy gate. For example, the active region of the dummy devices may end in the middle of their respective dummy gates.

In some embodiments, the dummy gate of dummy device 2002 is left to floating. That is, the dummy gate of dummy device 2002 is not connected to any signal. In addition, the dummy gate of dummy devices 1808, 1808, 2008 connected to the anti-fuse device are left floating. In other embodiments, the dummy gate of dummy devices 1808, 1808, 2008 connected to the anti-fuse device are connected to the control line CL.

ADDITIONAL CONFIGURATION CONSIDERATIONS

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A one-time programmable (OTP) memory device, comprising
a memory array having a plurality of memory elements, the memory array comprising:
an array of anti-fuse fin field-effect transistors (FinFETs), each anti-fuse FinFET having a first terminal for receiving a programming voltage and a second terminal, the array of anti-fuse FinFETs located in a first region of an integrated circuit, and
an array of access FinFETs, at least one anti-fuse FinFET of the array of anti-fuse FinFETs and at least one access FinFET of the array of access FinFETs forming a memory element of the plurality of memory elements of the memory array, each access FinFET configured to selectively couple one of a program inhibit voltage and a program enable voltage to the second terminal of a corresponding anti-fuse FinFET in a programming operation, the array of access FinFETs located in a second region of the integrated circuit.

2. The OTP memory device of claim 1, wherein each of the access FinFETs is connected to a corresponding anti-fuse FinFET from the array of anti-fuse FinFETs through a metal interconnect.

3. The OTP memory device of claim 1, wherein the array of anti-fuse FETs and the array access FETs are located in different physical locations.

4. The OTP memory device of claim 1, wherein the program inhibit voltage or the program enable voltage are provided at a bitline of the memory device.

5. The OTP memory device of claim 4, wherein the program inhibit voltage is a first supply voltage.

6. The OTP memory device of claim 4, wherein the program enable voltage is a ground voltage.

7. The OTP memory device of claim 1, wherein the anti-fuse FinFET further comprises one or more dummy gates.

8. The OTP memory device of claim 1, further comprising:
a plurality of precharge FinFETs located in the second region of the integrated circuit, each precharge FinFET configured to selectively couple one of a second program inhibit voltage or a second program enable voltage to the second terminal of a corresponding anti-fuse FinFET in a programming operation.

9. The OTP memory device of claim 1 wherein each precharge FinFET of the plurality of precharge FinFETs is connected in parallel to a corresponding access FinFET of the array of access FinFETs.

10. The OTP memory device of claim 1, wherein a gate oxide of access FinFETs is thicker than a gate oxide of the anti-fuse FinFETs.

11. A one-time programmable (OTP) memory bit circuit, comprising:
an anti-fuse FinFET having a first terminal for receiving a programming voltage and a second terminal, the anti-fuse FinFET located in a first region of an integrated circuit;
an access FinFET configured to selectively couple one of a program inhibit voltage and a program enable voltage to the second terminal of a corresponding anti-fuse FinFET in a programming operation, the access FinFET located in a second region of the integrated circuit, different than the first region of the integrated circuit; and
an interconnect coupling the second terminal of the anti-fuse FinFET to a drain terminal of the access FinFET, wherein the interconnect overlaps with at least a second access FinFET of a second OTP memory bit circuit.

12. The OTP memory bit circuit of claim 11, wherein an array of anti-fuse FinFETs is located in the first region of the integrated circuit, and an array of access FinFETs is located in the second region of the integrated circuit.

13. The OTP memory bit circuit of claim 11, wherein the interconnect overlaps with at least a second anti-fuse FinFET of a second OTP memory bit circuit.

14. The OTP memory bit circuit of claim 11, wherein at least a second access FinFET of a second OTP memory bit circuit is between the anti-fuse FinFET of the OTP memory bit circuit and the access FinFET of the OTP memory bit circuit.

15. The OTP memory bit circuit of claim 11, wherein at least a second anti-fuse FinFET of a second OTP memory bit circuit is between the anti-fuse FinFET of the OTP memory bit circuit and the access FinFET of the OTP memory bit circuit.

16. The OTP memory bit circuit of claim 11, wherein the first region is a core oxide device area and the second region is a high voltage FinFET area, wherein a gate oxide of the core oxide FinFET area is thinner than a gate oxide of the high voltage FinFET area.

17. The OTP memory bit circuit of claim 11, wherein the anti-fuse FinFET further comprises one or more dummy gates.

18. The OTP memory bit circuit of claim 11, further comprising:
a precharge FinFET located in the second region of the integrated circuit, the precharge FinFET for selectively coupling one of a second program inhibit voltage or a second program enable voltage to the second terminal the anti-fuse FinFET in a programming operation.

19. A method for operating a one-time programmable memory, comprising:
applying a programming voltage to a first terminal of an anti-fuse fin field-effect transistor (FinFET), the anti-fuse FinFET located in a first region of an integrated circuit having an array of anti-fuse FinFETs;
applying one of a program inhibit voltage and a program enable voltage to a first terminal of an access FinFET, the access FinFET having a second terminal coupled to a second terminal of the anti-fuse FinFET, the access FinFET located in a second region of the integrated circuit having an array of access FinFETs, different than the first region of the integrated circuit;
applying a first supply voltage to a gate of the access FinFET to activate the access FinFET;
responsive to the access FinFET being active, providing the voltage applied to the first terminal of the access FinFET to the second terminal of the anti-fuse FinFET; and responsive to providing the program enable voltage to the second terminal of the anti-fuse FinFET, programming the anti-fuse FinFET.

20. The method of claim 19, wherein programming the anti-fuse FinFET comprises:
forming a conducive link between the first terminal of the anti-fuse FinFET and the second terminal of the anti-fuse FinFET.

21. The method of claim 19, wherein an array of anti-fuse FinFETs is located in the first region of the integrated circuit, and an array of access FinFETs is located in the second region of the integrated circuit.

22. The method of claim 19, wherein the first region is a core oxide FinFET area and the second region is a high voltage FinFET area, wherein a gate oxide of the core oxide FinFET area is thinner than a gate oxide of the high voltage FinFET area.

* * * * *